United States Patent
Müller et al.

(10) Patent No.: US 10,833,476 B2
(45) Date of Patent: Nov. 10, 2020

(54) SURFACE-MOUNTABLE SEMICONDUCTOR LASER, ARRANGEMENT WITH SUCH A SEMICONDUCTOR LASER AND OPERATING METHOD FOR SAME

(71) Applicant: OSRAM OLED GmbH, Regensburg (DE)

(72) Inventors: Martin Müller, Bernhardswald (DE); Hubert Halbritter, Dietfurt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/461,337

(22) PCT Filed: Dec. 18, 2017

(86) PCT No.: PCT/EP2017/083328
§ 371 (c)(1),
(2) Date: May 15, 2019

(87) PCT Pub. No.: WO2018/114812
PCT Pub. Date: Jun. 28, 2018

(65) Prior Publication Data
US 2020/0067270 A1 Feb. 27, 2020

(30) Foreign Application Priority Data
Dec. 22, 2016 (DE) .......... 10 2016 125 430

(51) Int. Cl.
*H01S 5/022* (2006.01)
*H01S 5/042* (2006.01)
(Continued)

(52) U.S. Cl.
CPC ........ *H01S 5/02272* (2013.01); *H01S 5/0226* (2013.01); *H01S 5/0428* (2013.01);
(Continued)

(58) Field of Classification Search
CPC .............. H01S 5/04257; H01S 5/0425; H01S 5/04254–04257; H01S 5/0422–0424; H01S 5/3095
See application file for complete search history.

(56) References Cited

U.S. PATENT DOCUMENTS 4,829,534 A  *  5/1989  Miyazawa ............ H01S 5/0424
                                                        372/46.01
4,858,241 A  *  8/1989  Suzuki .................. H01S 5/0422
                                                        372/46.01
(Continued)

FOREIGN PATENT DOCUMENTS

CN    101253625 A  *  8/2008  .......... H01L 23/427
CN    103178442 A     6/2013
(Continued)

*Primary Examiner* — Joshua King
(74) *Attorney, Agent, or Firm* — Slater Matsil, LLP

(57) ABSTRACT

A surface-mountable semiconductor laser and an arrangement with such a semiconductor laser are disclosed. In one embodiment, the semiconductor laser is includes a semiconductor layer sequence having at least one generation region between a p-side and an n-side, at least two contact surfaces for external electrical contacting of the p-side and the n-side, wherein the contact surfaces are located on the same side of the semiconductor layer sequence in a common plane so that the semiconductor laser are contactable without bonding wires, at least one of a plurality of conductor rails extending from a side with the contact surfaces across the semiconductor layer sequence and a plurality of through-connections running at least through the generation region, wherein the generation region is configured to be pulse operated with time-wise current densities of at least 30 A/mm².

14 Claims, 14 Drawing Sheets

(51) Int. Cl.
*H01S 5/20* (2006.01)
*H01S 5/40* (2006.01)
*H01S 5/024* (2006.01)
*H01S 5/30* (2006.01)
*H01S 5/323* (2006.01)

(52) U.S. Cl.
CPC ...... *H01S 5/04254* (2019.08); *H01S 5/04257* (2019.08); *H01S 5/2022* (2013.01); *H01S 5/4031* (2013.01); *H01S 5/02469* (2013.01); *H01S 5/3095* (2013.01); *H01S 5/323* (2013.01)

(56) References Cited

U.S. PATENT DOCUMENTS

| | | | | |
|---|---|---|---|---|
| 4,862,474 A * | 8/1989 | Morinaga | H01S 5/227 | 372/50.1 |
| 5,003,359 A * | 3/1991 | Abeles | B82Y 20/00 | 257/20 |
| 5,155,560 A * | 10/1992 | Sheperd | H01S 5/0422 | 257/189 |
| 5,260,960 A * | 11/1993 | Amann | H01S 5/227 | 372/20 |
| 5,422,901 A * | 6/1995 | Lebby | H01L 23/3732 | 257/705 |
| 5,696,389 A * | 12/1997 | Ishikawa | H01L 33/20 | 257/99 |
| 5,821,568 A * | 10/1998 | Morita | H01S 5/0201 | 257/94 |
| 5,891,746 A * | 4/1999 | Kuchta | G01R 31/2822 | 438/16 |
| 5,966,396 A * | 10/1999 | Okazaki | H01S 5/32325 | 372/46.01 |
| 6,048,751 A | 4/2000 | D'Asaro et al. | | |
| 6,128,324 A * | 10/2000 | Shah | H01S 5/062 | 372/50.22 |
| 6,236,670 B1 | 3/2001 | Nagle et al. | | |
| 6,806,114 B1 * | 10/2004 | Lo | H01S 5/18361 | 438/36 |
| 6,835,956 B1 | 12/2004 | Nagahama | C30B 25/20 | 257/79 |
| 7,875,958 B2 * | 1/2011 | Cheng | B82Y 10/00 | 257/190 |
| 8,675,706 B2 | 3/2014 | Seurin et al. | | |
| 8,690,397 B2 * | 4/2014 | Muraguchi | H01L 24/24 | 362/382 |
| 8,831,061 B2 | 9/2014 | Lauer et al. | | |
| 9,780,269 B2 * | 10/2017 | Schwarz | H01L 33/0095 | |
| 2002/0137245 A1 | 9/2002 | Kitamura et al. | | |
| 2003/0039286 A1 * | 2/2003 | Doi | H01S 5/0202 | 372/45.01 |
| 2003/0052322 A1 | 3/2003 | Yamaguchi et al. | | |
| 2003/0053506 A1 | 3/2003 | Coldren | | |
| 2003/0107108 A1 * | 6/2003 | Takagi | H01S 5/0422 | 257/623 |
| 2003/0160258 A1 * | 8/2003 | Oohata | H01S 5/04256 | 257/99 |
| 2003/0231685 A1 | 12/2003 | Nakamura et al. | | |
| 2004/0130002 A1 * | 7/2004 | Weeks | H01L 31/1848 | 257/622 |
| 2006/0018358 A1 * | 1/2006 | Kadowaki | H01S 5/04256 | 372/87 |
| 2006/0065886 A1 * | 3/2006 | Shi | B82Y 20/00 | 257/13 |
| 2007/0152225 A1 | 7/2007 | Ooi et al. | | |
| 2007/0153868 A1 * | 7/2007 | West | H01S 5/0421 | 372/92 |
| 2007/0280319 A1 * | 12/2007 | Sekiguchi | H01S 5/3402 | 372/45.01 |
| 2008/0191365 A1 * | 8/2008 | Ueda | H01S 5/2086 | 257/778 |
| 2009/0046755 A1 | 2/2009 | Izu et al. | | |
| 2009/0200571 A1 * | 8/2009 | Ishida | H01S 5/34333 | 257/99 |
| 2011/0211604 A1 | 9/2011 | Roscher | | |
| 2011/0274130 A1 * | 11/2011 | Abeles | B82Y 20/00 | 372/45.01 |
| 2012/0287959 A1 * | 11/2012 | Tani | H01S 5/3223 | 372/45.01 |
| 2013/0049059 A1 * | 2/2013 | Odnoblyudov | H01L 33/382 | 257/99 |
| 2013/0272326 A1 * | 10/2013 | Yamatoya | H01S 5/04257 | 372/26 |
| 2014/0146842 A1 * | 5/2014 | Avramescu | H01S 5/22 | 372/44.01 |
| 2014/0247851 A1 * | 9/2014 | Hashimoto | B82Y 20/00 | 372/45.012 |
| 2014/0334512 A1 * | 11/2014 | Kwon | H01S 5/12 | 372/45.012 |
| 2015/0129901 A1 * | 5/2015 | Hoppel | H01L 33/38 | 257/88 |
| 2015/0229108 A1 * | 8/2015 | Steigerwald | H01S 5/0203 | 372/45.01 |
| 2015/0349490 A1 * | 12/2015 | Taguchi | H01S 5/062 | 372/38.05 |
| 2016/0111855 A1 * | 4/2016 | Wu | H01S 5/02476 | 372/38.05 |
| 2016/0233641 A1 * | 8/2016 | Chantre | G02B 6/12004 | |
| 2018/0212399 A1 * | 7/2018 | Menezo | H01S 5/1032 | |
| 2018/0278025 A1 * | 9/2018 | Leobandung | H01S 5/0424 | |
| 2018/0301866 A1 * | 10/2018 | Singer | H01S 5/34333 | |
| 2018/0301873 A1 * | 10/2018 | Singer | H01S 5/0422 | |

FOREIGN PATENT DOCUMENTS

| | | | | |
|---|---|---|---|---|
| DE | 3231579 A1 * | 5/1983 | | ......... H01S 5/04256 |
| DE | 102008022793 A1 | 12/2009 | | |
| DE | 102008058436 A1 | 5/2010 | | |
| DE | 102012209264 A1 | 12/2013 | | |
| DE | 102015116968 A1 * | 4/2017 | | ............ H01S 5/343 |
| DE | 102015116968 A1 | 4/2017 | | |
| DE | 102015116970 A1 * | 4/2017 | | ......... H01S 5/0224 |
| EP | 1873879 A1 | 1/2008 | | |
| JP | 57132387 A * | 8/1982 | | |
| JP | 58216487 A * | 12/1983 | | |
| JP | 60245188 A * | 12/1985 | | ......... H01S 5/06203 |
| JP | 2000058965 A | 2/2000 | | |
| JP | 2010192672 A | 9/2010 | | |
| JP | 2011071155 A | 4/2011 | | |
| JP | 2011077221 A | 4/2011 | | |
| WO | WO-2009082999 A2 * | 7/2009 | | ......... H01S 5/04254 |
| WO | 2014012760 A1 | 1/2014 | | |
| WO | WO-2017060161 A1 * | 4/2017 | | ............ H01S 5/343 |

\* cited by examiner

SURFACE-MOUNTABLE SEMICONDUCTOR LASER, ARRANGEMENT WITH SUCH A SEMICONDUCTOR LASER AND OPERATING METHOD FOR SAME

This patent application is a national phase filing under section 371 of PCT/EP2017/083328, filed Dec. 18, 2017, which claims the priority of German patent application 102016125430.4, filed Dec. 22, 2016, each of which is incorporated herein by reference in its entirety.

TECHNICAL FIELD

A surface-mountable semiconductor laser is specified. The invention further relates to an arrangement comprising such a semiconductor laser and to an operating method therefor.

SUMMARY OF THE INVENTION

Embodiments provide a semiconductor laser which can be operated in a pulsed manner with large currents and with high repetition rates.

According to at least one embodiment, the semiconductor laser can be surface-mounted. This means that the semiconductor laser is produced by placing on a surface of, for example, an electric driver and, for example, by means of subsequent heating and soldering or by means of adhesive bonding. That is, the semiconductor laser can be electrically and mechanically connected via surface mount technology or SMT for short.

According to at least one embodiment, the semiconductor laser comprises a semiconductor layer sequence. The semiconductor layer sequence comprises at least one generation region, wherein the generation region is designed to generate laser radiation. In particular, the generation region contains one or more active layers in which the laser radiation is generated by means of charge carrier recombination. Furthermore, the generation region preferably comprises waveguide layers and cladding layers. In the generation region, a current flow preferably takes place only or substantially only in the direction parallel to a growth direction of the semiconductor layer sequence. This means that the generation region is not or not significantly adapted to a lateral current spreading in the direction perpendicular to the growth direction.

According to at least one embodiment, the generation region and/or the semiconductor layer sequence and/or all semiconductor material of the semiconductor laser are situated between a p-side and an n-side. In particular, the p-side is designed as a contact region of the semiconductor material for an anode contact and the n-side for a cathode contact.

According to at least one embodiment, the semiconductor laser comprises at least two contact surfaces. The contact surfaces are configured for external electrical contacting. In particular, the contact surfaces are located directly on the p-side and/or on the n-side or are in ohmic contact with the p-side or the n-side and/or touch the p-side and/or the n-side. Preferably, in each case at least one contact surface for a cathode contact and an anode contact are present. The contact surfaces are preferably metallic surfaces. That is, the contact surfaces can be composed of one or more metals so that metallic contact surfaces are involved. In this case, all the contact surfaces can be of the same design or can be formed from different materials, in order to achieve an improved electrical connection to the p-side and the n-side, respectively.

According to at least one embodiment, the generating region is configured to be operated in a pulsed manner. A repetition rate between successive laser pulses and/or between pulse groups, also referred to as burst, is, for example, at least 1 Hz or 5 Hz or 15 Hz or 0.2 MHz or 0.5 MHz or 1 MHz. Alternatively or additionally, a repetition rate between successive laser pulses is at most 500 MHz or 100 MHz or 50 MHz, between consecutive pulse groups at most 15 MHz or 10 MHz or 5 MHz. Within the respective pulse group, the laser pulses can follow one another more quickly. Pulse groups are composed, for example, of at least two or five or ten or $1\times10^6$ or $10\times10^6$ and/or of at most $500\times10^6$ or $200\times10^6$ or $100\times10^6$ pulses.

According to at least one embodiment, the generation region is temporarily operated, in particular during the generation of the laser pulses, with high currents or current densities. As seen in a plan view of the generation region, the current densities are preferably at least 30 A/mm$^2$ or 80 A/mm$^2$ or 150 A/mm$^2$. Alternatively or additionally, this current density is at most 1000 A/mm$^2$ or 600 A/mm$^2$. In this case, the current direction in the generation region is preferably parallel or approximately parallel to the growth direction of the semiconductor layer sequence.

According to at least one embodiment, the electrical contact surfaces are located on the same side of the semiconductor layer sequence. In particular, the contact surfaces lie in a common plane. Said common plane is preferably oriented perpendicular to the growth direction of the semiconductor layer sequence. The term 'common plane' does not exclude that a small step occurs between the contact surfaces as a result of the production process, that is, the term 'common plane' can be provided with a tolerance of at most 3 μm or 2 μm or 1 μm or 0.2 μm in the direction perpendicular to this plane and/or to the contact surfaces. It is possible for the tolerance to be smaller than an average layer thickness of the contact surfaces. The contact surfaces lie particularly preferably at least partially in the common plane.

According to at least one embodiment, the semiconductor laser can be contacted without bonding wires. That is, the semiconductor laser can be soldered by means of the contact surfaces or adhesively bonded in an electrically conductive manner without bonding wires being used. As a result of the avoidance of bonding wires during the electrical contacting, an inductance of the electrical contact can be greatly reduced. As a result, high repetition rates and current densities can be achieved, as well as steep current flanks and thus steep pulse edges of the individual laser pulses.

In at least one embodiment, the semiconductor laser can be surface-mounted and comprises a semiconductor layer sequence, which comprises at least one generation region, which is configured to generate laser radiation and which is located between a p-side and an n-side. Furthermore, the semiconductor laser comprises at least two contact surfaces for the external electrical contacting of the p-side and of the n-side. The generation region is designed to be operated in a pulsed manner with time-wise current densities of at least 30 A/mm$^2$. The contact surfaces are located on the same side of the semiconductor layer sequence in a common plane, in particular with a tolerance of at most 2 μm, so that the semiconductor laser can be contacted without bonding wires and preferably via the contact surfaces, in particular exclusively via the contact surfaces, both mechanically and electrically.

During the mounting of semiconductor laser chips, bonding wires are usually used on an electrical contact side of a semiconductor layer sequence. However, this use of bonding wires has disadvantages. In particular, an additional process step is required in the electrical contacting due to the attachment of the bonding wires, which leads to increased costs. Furthermore, an additional electrical resistance, which limits the capabilities of the component, is generated by the bonding wires. In particular, however, the bonding wire limits a pulse rise time in pulsed laser operation on account of the inductance connected thereto.

For many applications, for example, in the environment scanning, pulse lengths in the range of 1 ns or of 2 ns with operating currents of 40 A or more are required. This cannot be realized with bonding wires or is only extremely difficult to realize. Measures such as an increase in thickness of the bonding wires, the use of as short bonding wires as possible or the increase in the number of bonding wires cannot, or only to a limited extent, overcome the described disadvantages.

In particular in the arrangement described here, semiconductor lasers are used which can be contacted directly with an electric driver without the use of bonding wires. The connection to the driver is realized, for example, by means of an electrically conductive adhesive or by means of a solder. In this case, this connection simultaneously takes over the mechanical fastening and the electrical connection. In order to achieve this, the electrical contact surfaces are located on the same side of the semiconductor layer sequence. By dispensing with bonding wires, the inductance of the system is considerably reduced. In this way, in particular at high current intensities, significantly steeper pulse rise edges of the laser pulses can be achieved. Furthermore, a cost reduction is associated with the saving of the bonding wires and an electrical resistance to the semiconductor laser is also reduced.

For example, in the case of a semiconductor laser which is soldered areally onto a cathode and which is connected to an anode via four bonding wires, an inductance due to the bonding wires is at approximately 0.25 nH, whereas the contribution of the semiconductor laser itself is typically only less than 0.05 nH. In this case, the contribution of the bonding wires to the total inductance of approximately 0.3 nH thus predominates. By contrast, with the contacting scheme described here without bonding wires, overall inductances of approximately 0.1 nH or less can be achieved. Thus, rise times and fall times of laser pulses can also be reduced by a factor of 3 or more.

According to at least one embodiment, the semiconductor layer sequence is based on a III-V compound semiconductor material. The semiconductor material is, for example, a nitride compound semiconductor material such as $Al_n In_{1-n-m} Ga_m N$ or a phosphide compound semiconductor material such as $Al_n In_{1-n-m} Ga_m P$ or also an arsenide compound semiconductor material such as $Al_n In_{1-n-m} Ga_m As$ or $Al_n Ga_m In_{1-n-m} As_k P_{1-k}$, wherein in each case $0 \leq n \leq 1$, $0 \leq m \leq 1$ and $n+m \leq 1$ and $0 \leq k \leq 1$. Preferably, the following applies to at least one layer or for all layers of the semiconductor layer sequence: $0 < n \leq 0.8$, $0.4 \leq m < 1$ and $n+m \leq 0.95$ as well as $0 < k \leq 0.5$, wherein the semiconductor layer sequence can have dopants and additional components. For the sake of simplicity, however, only the essential components of the crystal lattice of the semiconductor layer sequence are mentioned, that is Al, As, Ga, In, N or P, even if these can be partially replaced and/or supplemented by small quantities of further substances.

In particular, the semiconductor laser is based on the material system AlInGaAs, that is $Al_n In_{1-n-m} Ga_m As$, wherein Al as well as In, Ga and As are preferably present in the semiconductor layer sequence as essential constituents of a crystal lattice.

According to at least one embodiment, an intensity maximum of the generated laser radiation lies in the ultraviolet spectral range, in the visible spectral range, in the near-infrared spectral range or in the mid-infrared spectral range. The intensity maximum is preferably in the near-infrared spectral range, for example, at a wavelength of at least 780 nm and/or at most 1060 nm.

According to at least one embodiment, the pulse durations of the individual generated laser pulses are at least 0.2 ns or 1 ns or 1.5 ns or 2 ns or 5 ns and/or at most 100 ns or 40 ns or 12 ns or 6 ns. The pulse duration is in particular the full width at half the height of the maximum, also referred to as FWHM.

According to at least one embodiment, the semiconductor laser comprises a plurality of conductor rails. The conductor rails preferably extend in the direction parallel to the growth direction of the semiconductor layer sequence. In particular, the conductor rails extend completely through the generation region and/or the semiconductor layer sequence and/or all semiconductor material of the semiconductor laser. The conductor rails are preferably each connected to one type of electrical contact surface, for example, to the anode contacts or to the cathode contacts, and to the correspondingly associated p-side or n-side, in particular in an ohmic-conducting manner.

According to at least one embodiment, the conductor rails are located at an edge of the semiconductor layer sequence when viewed in a plan view. This means that the conductor rails are only partially surrounded by a material of the semiconductor layer sequence, seen in plan view. For example, the conductor rails are designed as half cylinders, wherein a longitudinal axis of the half-cylinder is preferably oriented parallel to the growth direction of the semiconductor layer sequence.

According to at least one embodiment, the semiconductor laser comprises a plurality of through-connections, also referred to as through-holes. The through-connections completely penetrate the generation region and/or the semiconductor layer sequence and/or all semiconductor material of the semiconductor laser, coming from one side of the contact surfaces. In this case, analogous to the conductor rails, the through-connections are conductively connected to one type of contact surfaces and to the associated p-side or n-side.

According to at least one embodiment, the through-connections lie within the semiconductor layer sequence when viewed in a plan view. The through-connections are thus surrounded all around by a material of the semiconductor layer sequence. For example, the through-connections are of cylindrical design, wherein a longitudinal axis of the cylinders can be oriented parallel to the semiconductor layer sequence.

According to at least one embodiment, the through-connections and/or the conductor rails are metallic current-conducting elements. That is, the through-connections and/or the conductor rails can consist of one or more metals. Furthermore, it is possible for the conductor rails and/or the through-connections to be designed as a solid body or as a coating. In the case of a coating, the through-connections and/or the conductor rails are formed, for example, as hollow bodies such as a hollow cylinder or a hollow cone or a double hollow cone. In the case of a solid body, the through-connections and/or the conductor rails are present, for example, as a solid cylinder or a solid cone or a full double cone.

According to at least one embodiment, the semiconductor laser has both through-connections and conductor rails. Alternatively, it is possible for exclusively conductor rails or exclusively through-connections to be present.

According to at least one embodiment, one, two or more than two trenches are formed in the semiconductor layer sequence. The trenches preferably have an elongated shape and extend, for example, completely or almost completely parallel to a resonator axis of the semiconductor laser.

According to at least one embodiment, the trenches have a bottom surface and side surfaces. The bottom surface can be oriented perpendicular to the growth direction of the semiconductor layer sequence and/or be oriented parallel to the contact surfaces. The side surfaces run in particular parallel to the growth direction of the semiconductor layer sequence and/or perpendicular to the contact surfaces. Alternatively, the side surfaces can be formed obliquely, for example, at an angle to the growth direction of the semiconductor layer sequence of at least 5° or 15° or 30° or 45° and/or of at most 70° or 50° or 40°.

According to at least one embodiment, the generation region is completely penetrated by the trenches. It is possible for the trenches to extend into a growth substrate of the semiconductor layer sequence.

Instead of a growth substrate, a replacement carrier different from a growth substrate can be present here and in the following.

According to at least one embodiment, the trenches are designed to prevent or suppress parasitic laser modes in the semiconductor laser. This is achieved in particular by the oblique side faces. A formation of laser modes in the direction parallel to a resonator axis is thus promoted via the trenches and laser modes in the direction oblique to the resonator axis are reduced or suppressed by the trenches.

According to at least one embodiment, the trenches are partially or completely filled with a material that absorbs laser radiation. The absorbent material can be a metal, a semiconductor material or an organic or inorganic dye. Absorbing means, for example, that the laser radiation is reflected upon impinging on the corresponding material to at most 90% or 70% or 50% or 30%.

According to at least one embodiment, at least one or all of the through-connections and/or of the conductor rails ends at the bottom surface. In this case, the through-connections and/or the conductor rails can come from the side with the electrical contact surfaces, wherein the plane with the electrical contact surfaces can lie on the growth substrate for the semiconductor layer sequence or on a side of the semiconductor layer sequence facing away from the growth substrate.

According to at least one embodiment, a current expansion element extends from the through-connections across at least one of the side faces of the trenches up to the p-side and the n-side. The current expansion element is preferably a metallic element. In this case, it is possible for the current expansion element to completely or partly form the absorbing material in the trench.

According to at least one embodiment, at least one of the through-connections extends from the p-side or the n-side through the trench to the bottom surface and ends at the bottom surface. In this case, said at least one through-connection preferably extends along a side surface of the trench which faces away from the generation region, and covers this side surface completely or, preferably, only partially. Either the n-side or the p-side, from which the respective through-connections does not come from, is electrically connected by means said at least one through-connection. In other words, that side, i.e., the p-side or the n-side, is electrically contacted by said at least one through-connection, which lies within the semiconductor laser, that is, in particular that side which is located between the generation region and the growth substrate.

According to at least one embodiment, the through-connections and/or the conductor rails are arranged in at least two rows when viewed in plan view. At least one of the rows is located on each side of the longitudinal axis. The longitudinal axis is preferably a resonator axis of the semiconductor laser. Each of the rows contains a plurality of the through-connections and/or of the conductor rails.

It is possible for more rows to be arranged on one side of the longitudinal axis than on another side of the longitudinal axis. The rows can run straight as seen in plan view and can be aligned parallel or approximately parallel to the longitudinal axis. Approximately parallel means, in particular, that an angle between the longitudinal axis and the respective row is at most 20° or 10° or 5°. All the rows can have the same angle to the longitudinal axis. Alternatively, the rows or at least some of the rows are oriented differently from the longitudinal axis.

According to at least one embodiment, the through-connections and/or the conductor rails are arranged mirror-symmetrically relative to a longitudinal axis of the semiconductor laser when viewed in plan view. The longitudinal axis is preferably a resonator axis of the semiconductor laser, once again seen in plan view. The resonator axis extends, for example, in a straight line between two resonator end faces of the semiconductor laser. In this case, preferably exactly one row of the through-connections and/or of the conductor rails is located on both sides of the longitudinal axis. Alternatively, a plurality of rows of through-connections and/or conductor rails can be present on both sides of the longitudinal axis. Alternatively, the at least one through-connections and/or conductor rail is/are located only on one side of the resonator axis, seen in a plan view.

In the rows, the through-connections and/or the conductor rails are preferably arranged along a straight line. Along this straight line, the through-connections and/or the conductor rails can be arranged equidistantly with respect to one another or can also have a density gradient, so that, for example, the through-connections and/or the conductor rails are arranged more densely in the center of this arrangement line than at the ends of this line.

It is possible for the through-connections and/or the conductor rails to be arranged offset with respect to one another in adjacent rows, in particular coming from a radiation coupling-out surface of the resonator. This applies both to rows on one side of the longitudinal axis and to rows which are arranged on both sides of the longitudinal axis. If there is a plurality of rows on one side of the longitudinal axis, thus, the through-connections and/or the conductor rails can be arranged in a preferably regular hexagonal pattern when viewed in plan view. The rows can have identical numbers of the through-connections and/or of the conductor rails or also can have different numbers.

According to at least one embodiment, the semiconductor laser has at least six or eight or 12 or 20 and/or at most 64 or 42 or 24 or 16 of the through-connections and/or of the conductor rails. Alternatively or additionally, the distances between adjacent through-connections and/or conductor rails, in particular within the rows, are at least 5 µm or 10 µm and/or at most 50 µm or 20 µm. Alternatively or additionally, an average diameter of the through-connections and/or of the conductor rails is at least 10 µm or 15 µm and/or at most 80 µm or 40 µm.

According to at least one embodiment, the through-connections are connected to one another on the p-side and/or on the n-side by means of a continuous, flat and/or metallic current expansion element. This applies in particular to through-connections and/or conductor rails which are located on both sides of the longitudinal axis. The current expansion element is formed, for example, by a metal layer made of one or more metals and optionally of a plurality of metal partial layers.

According to at least one embodiment, the current expansion element areally contacts the generation region. In particular, the current expansion element is located directly on the p-side or on the n-side. Viewed in a plan view, the generation region can be completely covered by the current expansion element and can be electrically contacted over the whole area.

According to at least one embodiment, the semiconductor layer sequence comprises one or more current-conducting layers made of a semiconductor material. The at least one current-conducting layer is preferably planar and can extend over the entire semiconductor layer sequence, in particular in the direction perpendicular to the growth direction of the semiconductor layer sequence. The current-conducting layer is designed for lateral current spreading, that is, for a current spreading in the direction perpendicular to the growth direction of the semiconductor layer sequence.

According to at least one embodiment, the current-conducting layer is located on only one side of the generation region, in particular on a side of the generation region facing the growth substrate or the replacement carrier. The current-conducting layer can thus be at a different side of the semiconductor layer sequence than the contact surfaces.

According to at least one embodiment, the semiconductor laser is, if a current-conducting layer is present on the semiconductor base, free from a current expansion element. Such a current expansion element would be, for example, a metal layer or an oxide layer, for example, from a transparent conductive oxide such as indium tin oxide.

According to at least one embodiment, the current-conducting layer is in ohmic contact with one of the contact surfaces or with one type of contact surfaces, that is, for example, with the anode contacts or with the cathode contacts.

According to at least one embodiment, the current-conducting layer is based on the same material system as the generation region, that is, for example, in each case on AlInGaAs. In order to achieve a higher electrical conductivity of the current-conducting layer, in particular in the lateral direction, the current-conducting layer is preferably more highly doped by at least a factor of 5 or a factor of 10 than the generation region. For example, a dopant concentration in the current-conducting layer is at least $1 \times 10^{18}$ cm$^{-3}$ or $1 \times 10^{19}$ cm$^{-3}$ or $1 \times 10^{20}$ cm$^{-3}$.

According to at least one embodiment, viewed in a plan view, a quotient of a surface area of the through-connections and/or of the conductor rails taken together and of an area of the generation region at least 0.02 or 0.05 or 0.1. As an alternative or in addition, this quotient is at most 0.3 or 0.2 or 0.1. In other words, the through-connections and/or the conductor rails assume a comparatively large area in plan view and relative to the generation region.

According to at least one embodiment, the semiconductor laser comprises a growth substrate on which the semiconductor layer sequence is grown. The growth substrate is preferably made of an electrically conductive material, in particular of a semiconductor material. For example, the growth substrate is a GaAs substrate.

According to at least one embodiment, the semiconductor laser is an edge emitter. This means that a resonator axis and/or an emission direction of the semiconductor laser is oriented perpendicular to the growth direction of the semiconductor layer sequence. Alternatively, the semiconductor laser is a surface emitter whose resonator axis and/or emission direction is oriented parallel to the growth direction of the semiconductor layer sequence.

According to at least one embodiment, the generation region comprises a plurality of active layers. The active layers preferably follow one another along the growth direction of the semiconductor layer sequence and, viewed in plan view, can be arranged congruently with respect to one another. It is possible for the active layers to be electrically interconnected, in particular connected in series, within the generation region via tunnel diodes.

According to at least one embodiment, the semiconductor layer sequence has two or more than two generation regions. Preferably, the generation regions are arranged adjacent to one another as seen in plan view and are spaced apart from one another. The generation regions can be arranged parallel to one another so that in particular resonator axes of the generation regions are oriented parallel to one another and/or lie in the same plane, relative to a direction perpendicular to the growth direction of the semiconductor layer sequence.

According to at least one embodiment, the contact surfaces or at least one of the contact surfaces or one type of contact surfaces, that is the anode contact or the cathode contact, are located between the adjacent generation regions, seen in plan view. Alternatively or additionally, the through-connections or some of the through-connections can be located between the adjacent generation regions, seen in a plan view.

The invention further relates to an arrangement. The arrangement comprises at least one semiconductor laser, as indicated in connection with one or more of the above-mentioned embodiments. Features of the arrangement are therefore also disclosed for the semiconductor laser and vice versa.

In at least one embodiment, the arrangement comprises one or more semiconductor lasers and one or more drivers. The electric driver is configured for pulsed operation of the at least one semiconductor laser. In particular, the at least one semiconductor laser can be operated temporarily with currents of at least 10 A or 20 A or 40 A and/or of at most 150 A or 100 A or 60 A by means of the driver. In this case, the semiconductor laser is electrically connected to the driver without bonding wires so that the two contact surfaces of the semiconductor laser are located on a side of the semiconductor layer sequence facing the driver.

Furthermore, an operating method is provided by means of which such an arrangement and/or such a semiconductor laser is operated. Features of the operating method are therefore also disclosed for the arrangement and the semiconductor laser and vice versa.

In at least one embodiment, according to the operating method, the semiconductor laser is operated in a pulsed manner with time-wise current densities of at least 30 A/mm$^2$ in the generation region, viewed in a plan view.

BRIEF DESCRIPTION OF THE DRAWINGS

A semiconductor laser described herein, an arrangement described herein and an operating method described herein are explained below in more detail with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

In the figures.

DETAILED DESCRIPTION OF ILLUSTRATIVE EMBODIMENTS

Figure 1A:
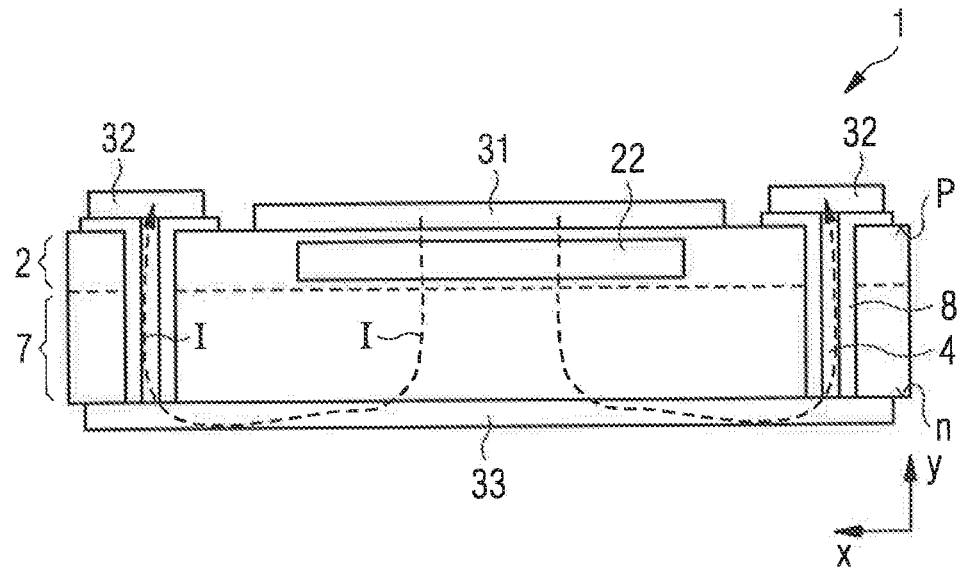
FIGS. 1 to 4 and FIGS. 16A to 16B show schematic sectional illustrations and plan views of exemplary embodiments of semiconductor lasers.
Figure 1B:
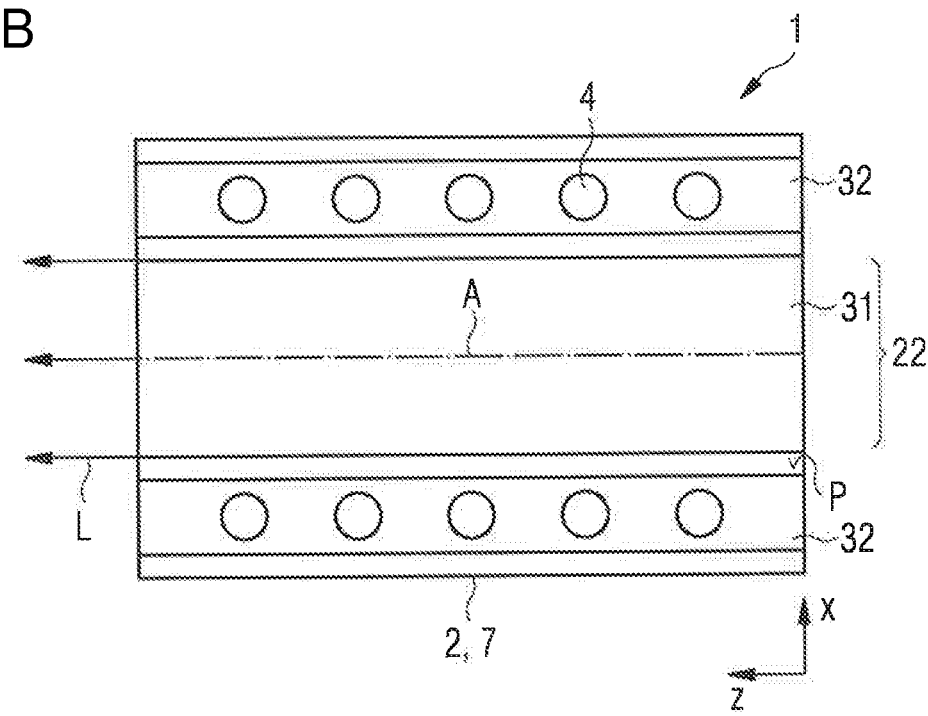

FIG. 1 illustrates an exemplary embodiment of a semiconductor laser 1, see the sectional view in FIG. 1A and the top view in FIG. 1B.

The semiconductor laser 1 comprises a growth substrate 7, for example, of GaAs. A semiconductor layer sequence 2, which is preferably based on AlInGaAs, is situated on the growth substrate 7. A generation region 22 is located in the semiconductor layer sequence 2; the generation region 22 is configured for generating laser radiation L by means of charge carrier recombination. An n-conducting n-side n is formed by the electrically conductive growth substrate 7 and a p-conducting p-side p is formed by the semiconductor layer sequence 2.

Furthermore, the semiconductor laser 1 comprises electrical contact surfaces 31, 32. The electrical contact surfaces 31, 32 are formed by metallic coatings, for example, of chromium, gold, platinum and/or titanium. In this case, the contact surfaces 31, 32 are located on the side with the semiconductor layer sequence 2. The contact surface 31 is an anode contact; the two contact surfaces 32 constitute a cathode contact. In FIG. 1, the generation region 22 below the contact surface 31 can be identical to the semiconductor layer sequence 2 and, thus, can directly adjoin the growth substrate 7 and the contact surface 31.

The semiconductor layer sequence 2 is directly electrically contacted by means of the contact surface 31. Coming from the contact surfaces 32, electrical through-connections 4 extend completely through the semiconductor layer sequence 2 and through the growth substrate 7 to the n-side n. A current expansion element 33, which is likewise formed from metal layers, is located on the n-side n. The current expansion element 33 is impermeable to the laser radiation L and preferably has a thickness of at least 100 nm, as can also apply to all other exemplary embodiments.

The semiconductor laser 1 is thus electrically contacted externally by means of the contact surfaces 31, 32, which are located in a common plane, and can be connected without bonding wires being required. A current flow I within the semiconductor laser 1 is symbolized by a dashed line. The through-connections 4 are electrically separated from the semiconductor layer sequence 2 and from the growth substrate 7, for example, by means of electrical insulation layers 8, such as silicon dioxide layers.

The contact surfaces 31, 32 run parallel to a longitudinal axis A along a longitudinal direction z. The longitudinal axis A simultaneously forms a resonator axis of the edge-emitting semiconductor laser 1. The through-connections 4 run parallel to a growth direction y of the semiconductor laser. The through-connections 4 are arranged symmetrically to the longitudinal axis A. On both sides of the longitudinal axis A, the through-connections 4 extend equidistantly along a straight line parallel to the longitudinal axis A. A diameter of the through-connections 4 is, for example, approximately 20 µm; a distance between adjacent through-connections 4 is approximately 10 µm, for example. Viewed in a plan view, the generating region 22 extends approximately congruently with the contact surface 31.

As in all other exemplary embodiments, the growth substrate 7 has, for example, a thickness of at least 50 µm and/or of at most 200 µm. A thickness of the semiconductor layer sequence 2 along the growth direction y, is, for example, at least 3 µm or 5 µm and/or at most 25 µm. Along the longitudinal direction z, the semiconductor laser 1 has, for example, an extent of at least 300 µm or 600 µm and/or of at most 5 mm or 3 mm or 2 mm or 1 mm. Along a transverse direction y, a width of the semiconductor laser 1 is in particular at least 200 µm or 300 µm and/or at most 800 µm or 500 µm. A proportion of the generation region 22 at the width of the semiconductor laser 1 is, for example, at least 15% or 30% or 45% and/or at most 80% or 70% or 55%.

Deviating from the representation in FIG. 1, as in all other exemplary embodiments, it is possible that the semiconductor laser 1 is a so-called multi-emitter and/or a laser bar, which has a plurality of semiconductor regions or generation regions 22 which are arranged next to one another and/or are stacked one above the other.

In FIG. 1B, only one row with the through-connections 4 is drawn on both sides of the longitudinal axis A. As is also possible in all other exemplary embodiments, a plurality of such rows can also be present on each side of the longitudinal axis A.

Figure 2A:
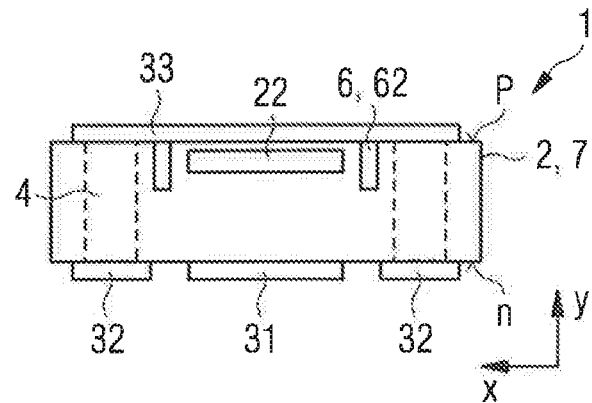
Figure 2B:
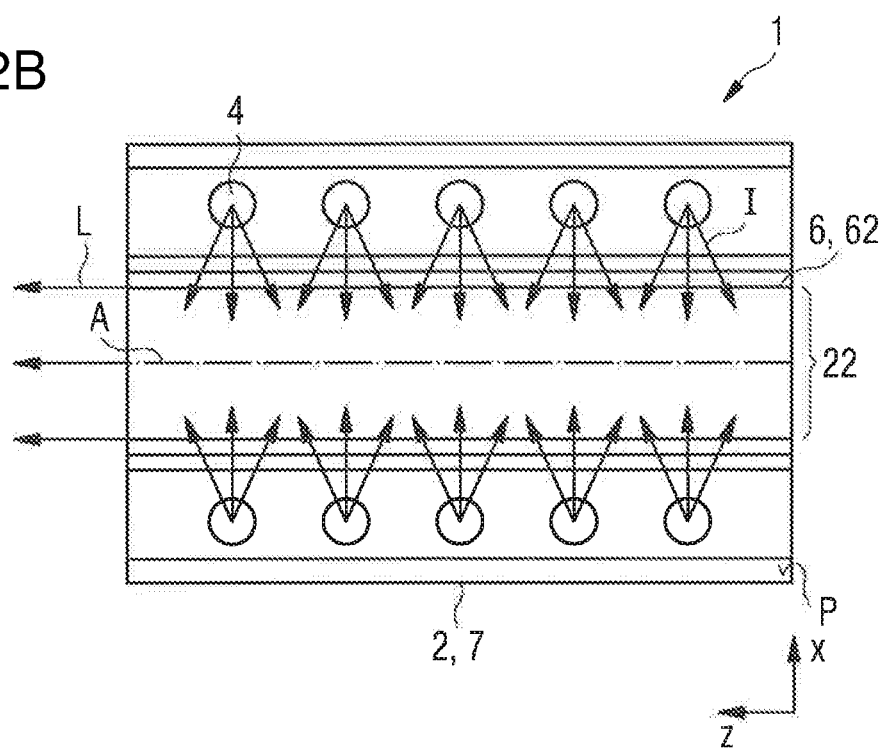

In the exemplary embodiment of FIG. 2, the current flow I is schematically illustrated in the plan view in FIG. 2B. In order to simplify the illustration, the insulation layers 8 in FIG. 1 are not shown in FIG. 2.

In contrast to FIG. 1, the current expansion element 33 is located on the side with the generation region 22 and, hence, the contact surfaces 31, 32 are located on the side of the growth substrate 7 facing away from the generation region 22. The current expansion element 33 connects all through-connections 4 to one another in a whole-area manner.

Optionally, as is also possible in all other exemplary embodiments, a plurality of trenches 6 are located on the semiconductor layer sequence 2 adjacent to the generation region 22. The trenches 6 preferably extend completely along and parallel to the longitudinal axis A. The trenches 6 can be filled with a material 62 which is absorbent for the laser radiation L. The absorbent material 62 is formed, for example, by an absorbent metal or by an absorbent semiconductor material.

Figure 3A:
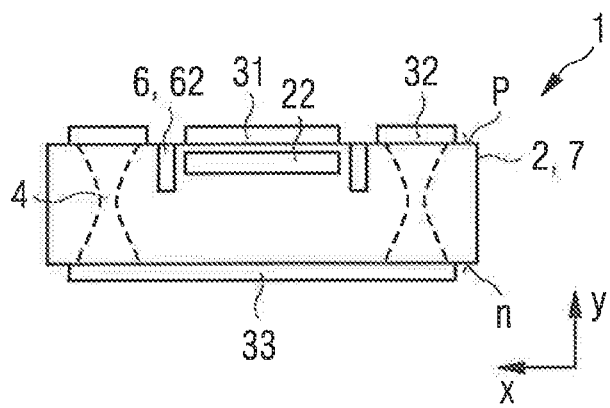
Figure 3B:
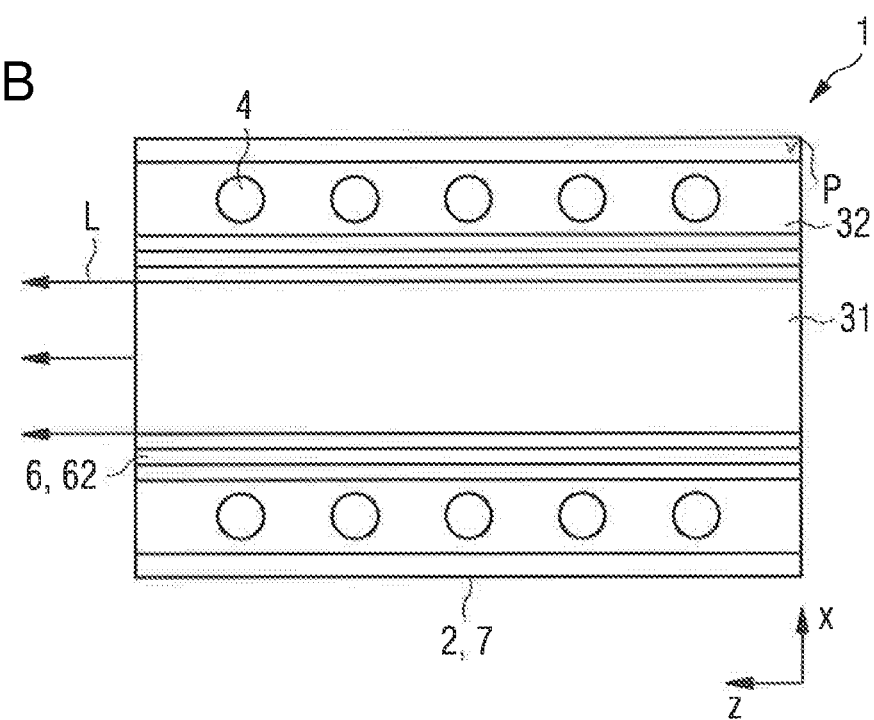

The basic scheme of the electrical contacting of the semiconductor laser 1 of FIG. 3 corresponds to that of FIG. 1, wherein the trenches 6 with the absorbent material 62 are optionally present.

As in all other exemplary embodiments, it is possible that the through-connections 4 are not shaped as cylinders, but as a cone or, as illustrated in FIG. 3A, as a double cone. The double cone shape of the through-connections 4 is produced, for example, by etching both sides of the semiconductor layer sequence 2 and of the growth substrate 7 in order to generate the through-connections 4.

Figure 4A:
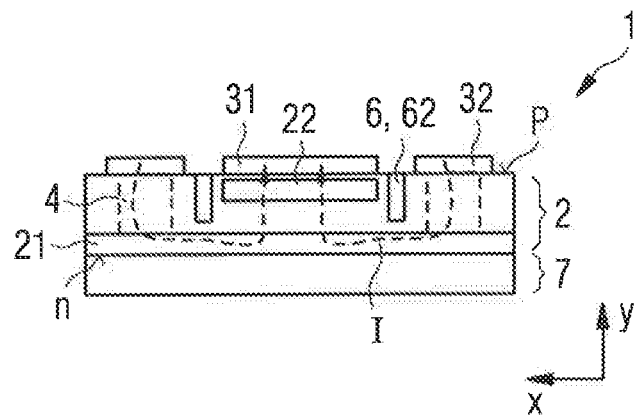
Figure 4B:
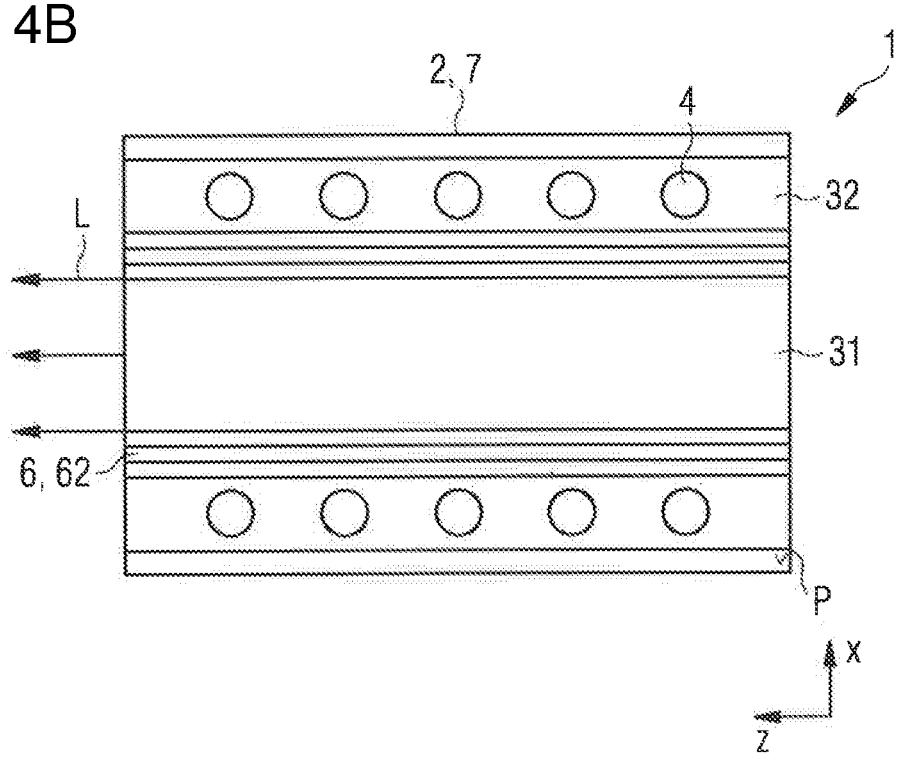

In the exemplary embodiment of FIG. 4, the semiconductor layer sequence 2 additionally comprises a highly doped current-conducting layer 21, which leads to a lateral current spreading, that is, to a current expansion in the transverse direction x and optionally also in the longitudinal direction z. The current-conducting layer 21 extends over the whole area across the semiconductor layer sequence 2 and is located between the generation region 22 and the growth substrate 7. A current flow I is symbolized by arrows.

According to FIG. 4, the trenches 6 do not reach as far as the current-conducting layer 21. There is no or no significant lateral current expansion within the generation region 22 and within the areas of the semiconductor layer sequence 2 which are different from the current-conducting layer 21. This means that a current flow through the generation region 22 is oriented substantially parallel to the growth direction y.

Otherwise, the exemplary embodiment of FIG. 4 corresponds to that of FIG. 1.

Figure 5:
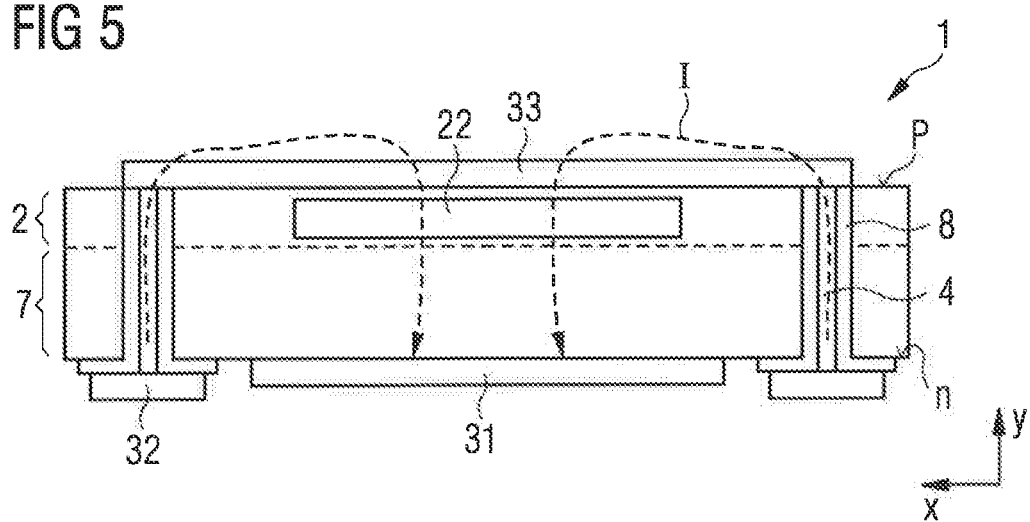
FIGS. 5 to 14 and FIGS. 17 to 18 show schematic sectional representations of exemplary embodiments of semiconductor lasers.

The electrical contacting scheme of FIG. 5 corresponds to that of FIG. 2, but no trenches are present.

Figure 6:
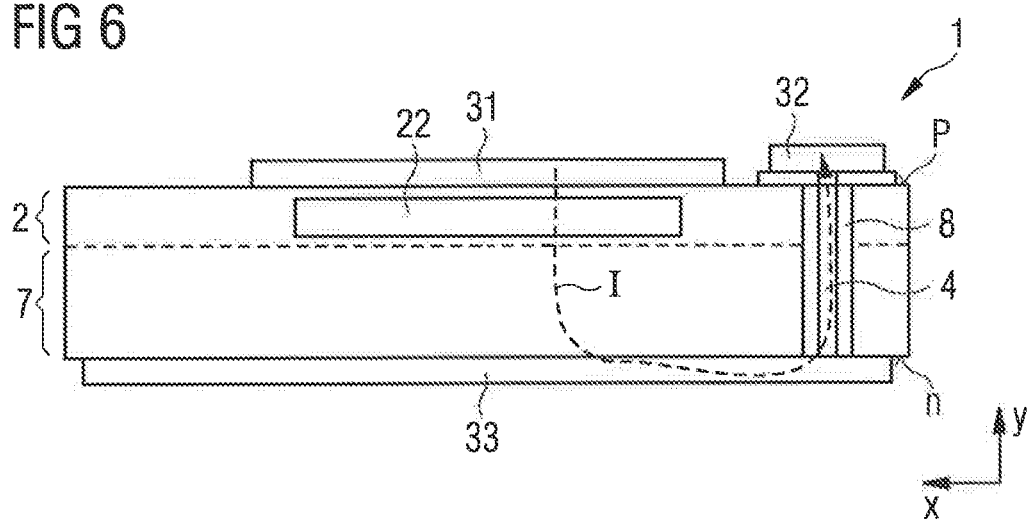

FIG. 6 illustrates that the through-connections 4 are located only on one side of the generation region 22, along the transverse direction x. In addition, the contacting preferably corresponds to that illustrated in FIG. 1.

Figure 7:
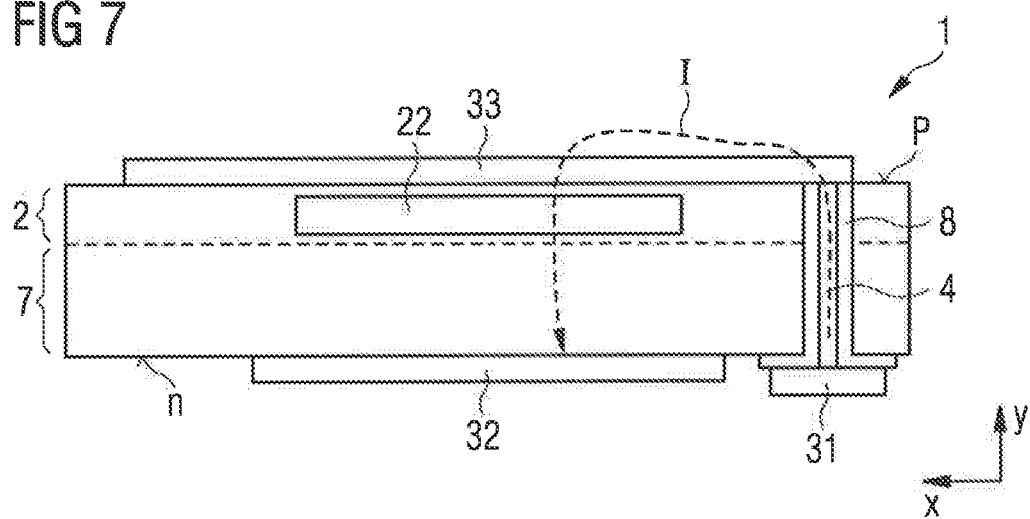

In the exemplary embodiment of FIG. 7, too, the plated through-connections 4 are present only on one side of the generation region 22, along the transverse direction x. Otherwise, the exemplary embodiment of FIG. 7 corresponds to that of FIG. 5.

Viewed in a plan view, the through-connections 4 of FIGS. 1 to 7 are each surrounded all around by a material of the semiconductor layer sequence 2. In contrast, no through-connections, but conductor rails 5 are present in FIG. 8. The conductor rails 5 are located at an edge of the semiconductor layer sequence 2, viewed along the transverse direction x. The conductor rails 5 also completely penetrate the semiconductor layer sequence 2 and the growth substrate 7, viewed parallel to the growth direction y. When viewed in a plan view, not illustrated, the conductor rails 5 are, for example, of semicircular shape.

Figure 8:
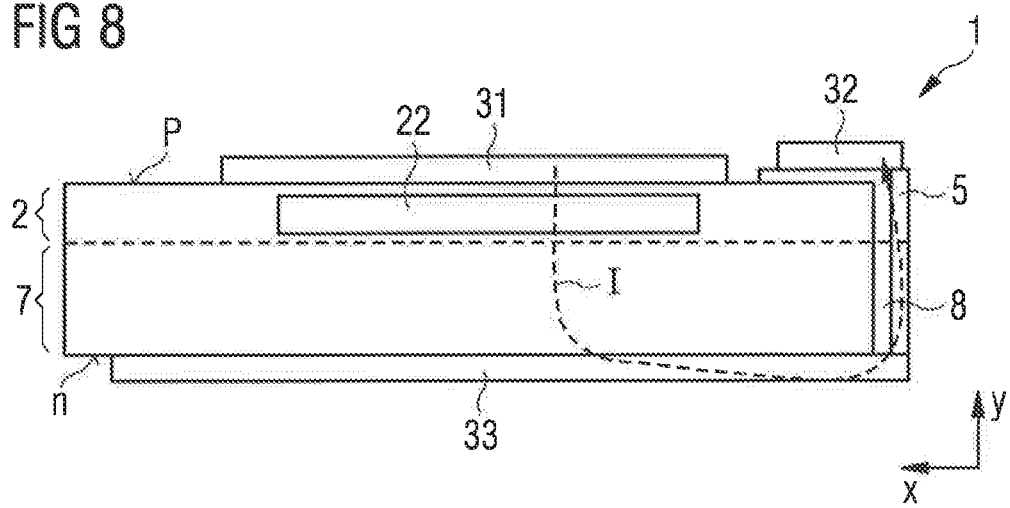

Otherwise, the exemplary embodiment of FIG. 8 corresponds to that of FIG. 6. In a different manner to that shown in FIG. 8, the conductor rails 5 can also be present on both sides of the generation region 22, analogously to the exemplary embodiment of FIG. 1.

Figure 9:
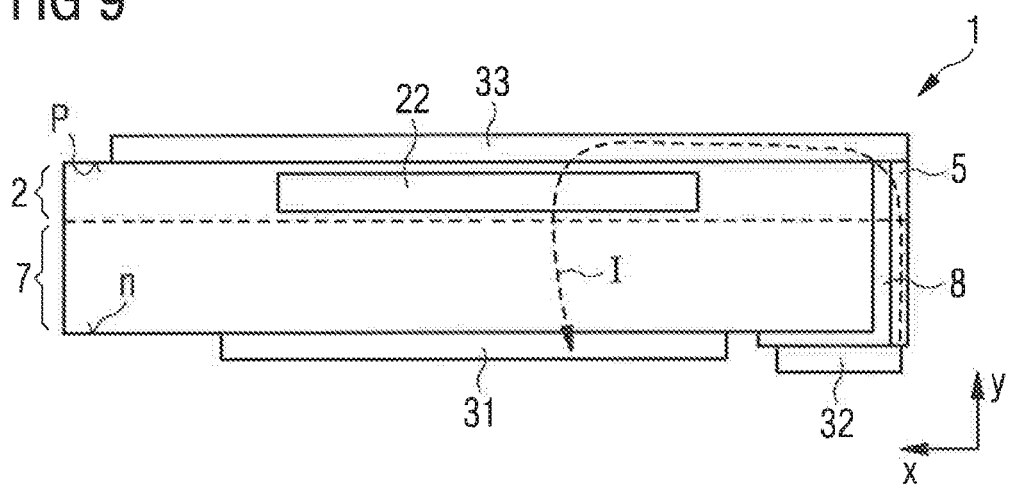

According to FIG. 9, the contact surfaces 31, 32 and the current expansion element 33 are located on opposite sides of the growth substrate 7 and of the semiconductor layer sequence 2. Otherwise, the description in relation to FIG. 8 applies in the same way to FIG. 9.

Figure 10:
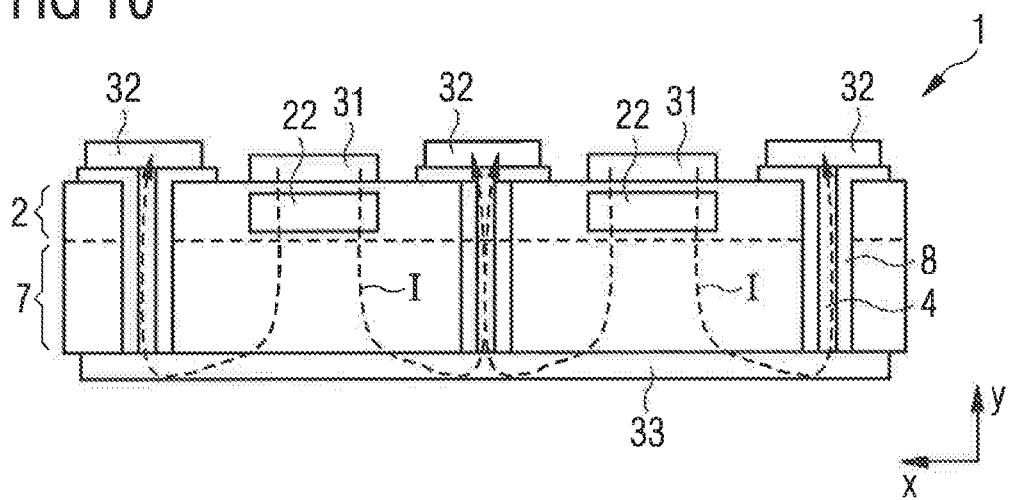

In the exemplary embodiment of FIG. 10, generation regions 22 which are separated from one another are present. Viewed along the transverse direction x, between the generation regions 22 a row with the through-connections 4 is located. In this case, all through-connections 4 are electrically short-circuited via the current expansion element 33. An individual activation of the generation regions 22 can be achieved via the contact surfaces 31. On the semiconductor layer sequence 2, the contact surfaces 32 alternate with the contact surfaces 31, seen along the transverse direction x.

Otherwise, the exemplary embodiment of FIG. 10 corresponds to that of FIG. 1. In contrast to the illustration in FIG. 10, the contacting scheme of FIG. 5 can also be used so that the contact surfaces 31, 32 and the current expansion element 33 are in each case located on opposite sides, compared with the representation in FIG. 10.

Figure 11:
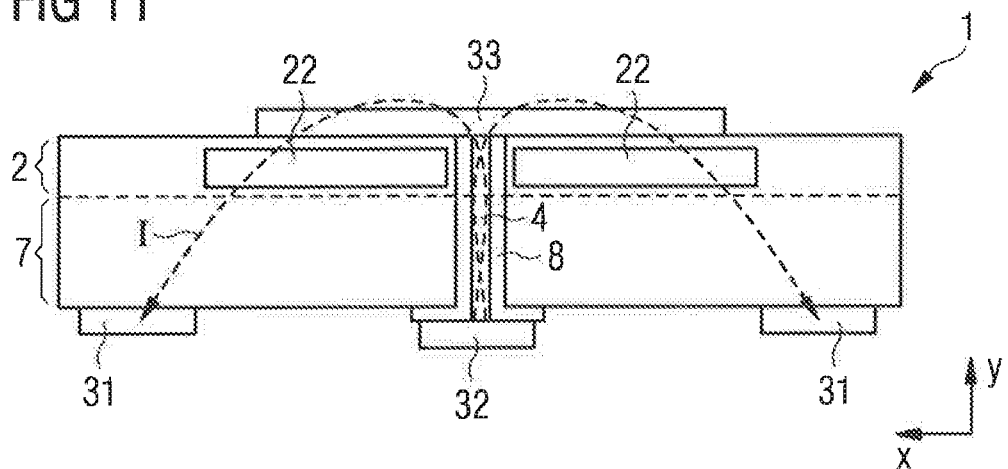

In the exemplary embodiment of FIG. 11, only one row having the through-connections 4 is present. The two generation regions 22, between which the through-connections 4 are located, can be controlled electrically independently of one another by means of the contact surfaces 31. A current flow I is symbolically illustrated by a dashed line.

Otherwise, the exemplary embodiment of FIG. 11 corresponds to that of FIG. 5. Alternatively, the contacting scheme of FIG. 1 can be used in the same way.

Figure 12:
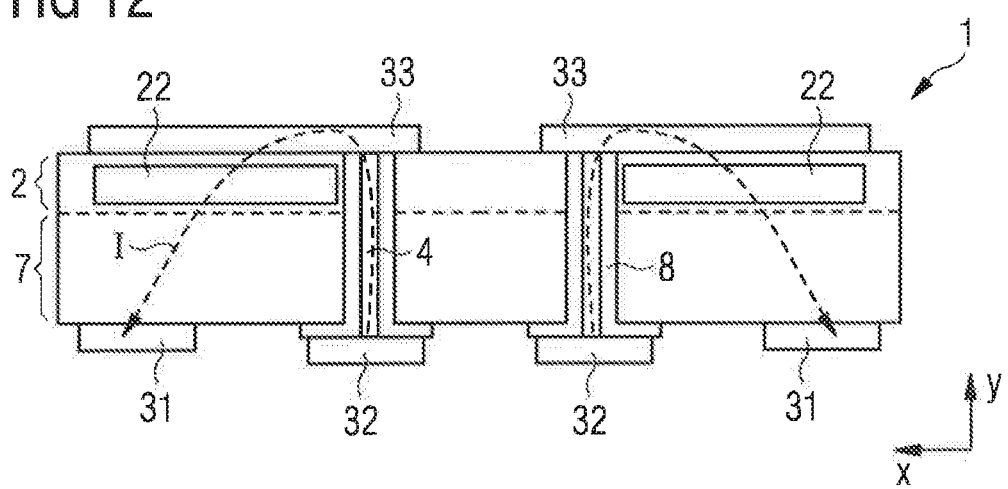

In the exemplary embodiment of FIG. 12, two rows of the through-connections 4 are located along the transverse direction x between the generation regions 22. A separate current expansion element 33 is present for each of the generation regions 22. Thus, a first contact surface 31 and a second contact surface 32 are provided for each generation region 22. In other words, in the semiconductor layer sequence 2 and in the growth substrate 7 a total of two of the semiconductor lasers from FIG. 7 are integrated in a single semiconductor laser 1.

Deviating from the representation in FIG. 12, the contacting scheme of FIG. 6 can also be used. Likewise, two rows of through-connections 4 can be present for each generation region 22 of FIG. 12, so that two of the semiconductor lasers of FIG. 5 can be integrated in an element analogous to FIG. 12.

In FIGS. 10 to 12, only two generation regions 22 are represented in each case. In the same way, more than two of the generation regions 22 can also be present.

Figure 13:
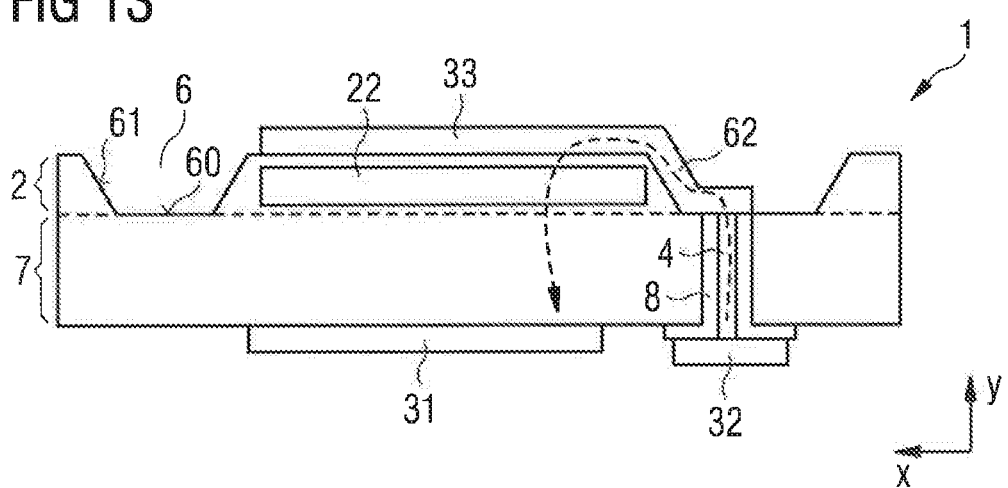

FIG. 13 illustrates a further type of exemplary embodiments of the semiconductor laser 1. In this case, the trenches 6 are present, which have a bottom surface 60 and side surfaces 61. The bottom surface 60 is oriented perpendicular to the growth direction y, the side surfaces 61 run obliquely to the growth direction y and to the transverse direction x. In the direction away from the growth substrate 7 that can alternatively be formed by a replacement carrier as in all other exemplary embodiments too, a width of the trenches 6 increases continuously.

Coming from the side with the contact surfaces 31, 32, the through-connections 4 extends completely through the growth substrate 7 and end at the bottom surface 60 of the trench 6. The current expansion element 33 extends across the side surface 61 facing the generation region 22 towards an area of the semiconductor layer sequence 2 above the generation region 22.

The contacting scheme of FIG. 13 thus corresponds to that of FIG. 7. In the same way, the contacting scheme of FIG. 5 can alternatively be used. Likewise, the contacting scheme of FIG. 9 or of FIG. 9 analogously to FIG. 5 can be used. Thus, the through-connections 4 or the conductor rails 5 each end, as shown in FIG. 13, on the bottom surface 60.

Figure 14:
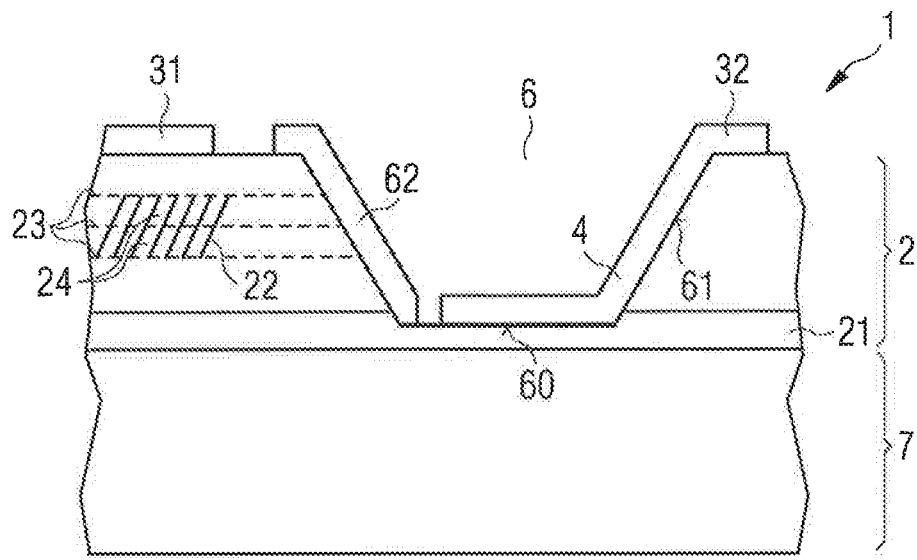

According to FIG. 14, the contact surfaces 31, 32 are located on the side of the semiconductor layer sequence 2 facing away from the growth substrate 7 or from the replacement carrier. Herein, the semiconductor layer sequence 2 comprises the current-conducting layer 21. Furthermore, as is also possible in all other exemplary embodiments, there is a plurality of active layers 23, between each of which a tunnel diode 24 is located. For example, at least two or at least three and/or at most ten or at most five of the active layers 23 are present.

The contact surface 31 is located above the generation region 22. In contrast, the contact surface 32 extends through the trench 6 across the through-connections 4 as far as into the current-conducting layer 21. During formation of the trench 6, the current-conducting layer 21 is only partially removed. The through-connection 4 is restricted to the side surface 21 of the trench 6 which faces away from the generation region 22; the trench 6 runs preferably continuous along the longitudinal direction z. The material 62 absorbent for the laser radiation L is optionally located on the side surface 61 facing the generation region 22.

Figure 15:
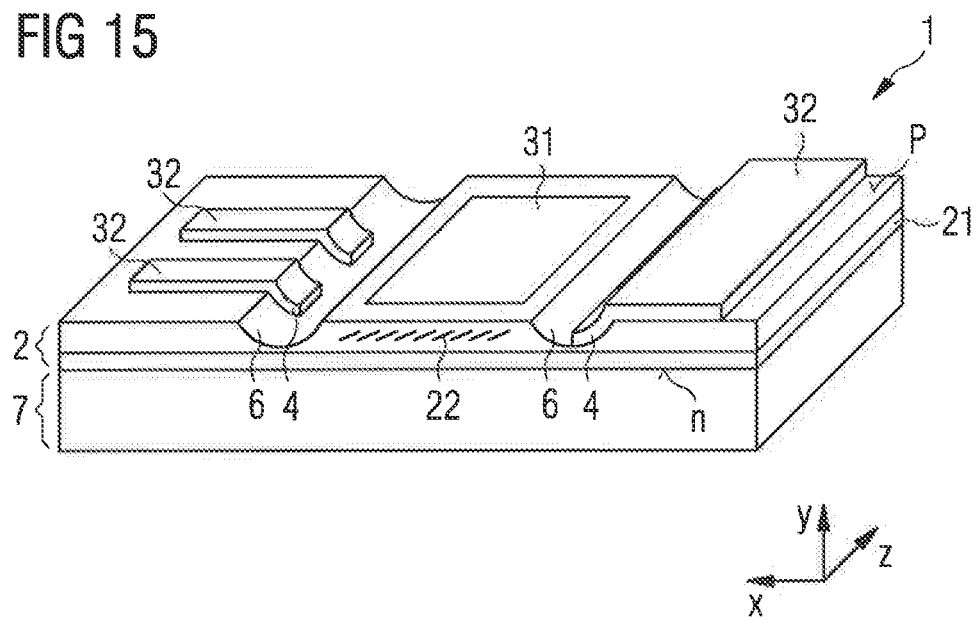
FIG. 15 shows a schematic perspective illustration of a semiconductor laser.

In the perspective representation of the exemplary embodiment of FIG. 15, variants with respect to the exemplary embodiment of FIG. 14 are illustrated. In this case, for exemplification, the through-connections 4 are designed differently from one another on the left and on the right of the generation region 22. Within a component, all through-holes 4 are preferably of the same design.

On the left of the generation region 22, according to FIG. 15 the contact surfaces 32 and the through-connections 4 are strip-shaped. On the right-hand side of the generation region 22 in FIG. 15, on the other hand, a single flat contact surface 32 is present, which extends in the form of the continuous through-connection 4 to the current-conducting layer 21 in the trench 6.

Deviating from the illustration in FIG. 15, see the through-connections 4 on the left-hand side of the generation region 22, a single, continuous contact surface 32 can be provided, from which the through-connections 4 extend in a finger-like manner.

According to FIG. 15, the trenches 6 are semicircular or semi-round when viewed in cross section. In contrast, in FIG. 14, the trenches are of trapezoidal shape, whereas the trenches have a rectangular shape, for instance, in FIG. 2. The respective shapes of the trenches 6 can be interchanged between the exemplary embodiments so that, for example, in FIG. 14 the trenches 6 can also have a semicircular or rectangular shape.

Figure 16A:
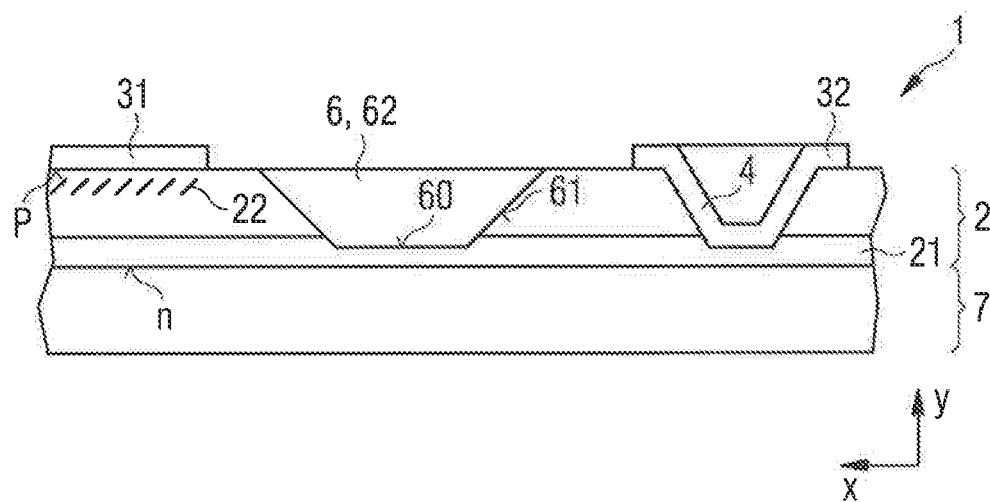
Figure 16B:
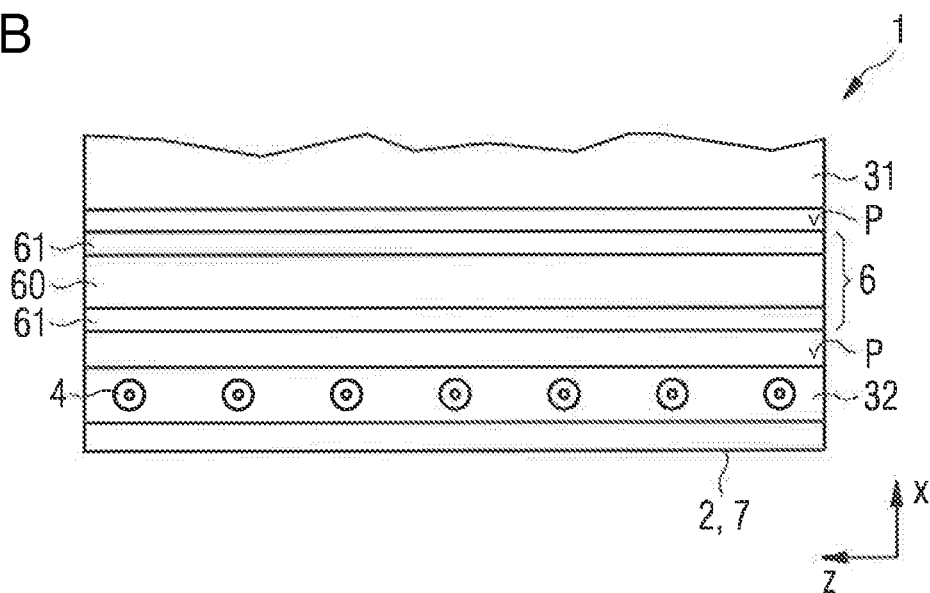

Along the transverse direction x, only one half of the semiconductor laser 1 is illustrated in FIG. 16. In the exemplary embodiment of FIG. 16, the contacting scheme is carried out analogously to that of FIGS. 14 and 15. However, the through-connections 4 are located next to the trenches 6 so that the generation region 22 is separated from the through-connections 4 by the trenches 6. In this case, the through-connections 4 extend from a preferably single continuous and strip-shaped contact surface 22 into the current-conducting layer 21. The through-connections 4 are each in the shape of a truncated cone.

Figure 17:
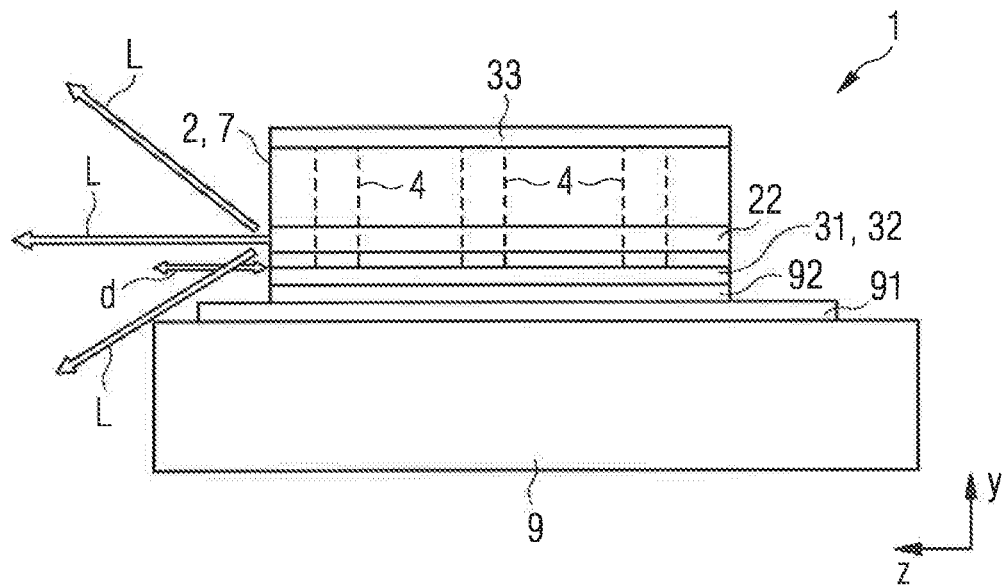
Figure 18:
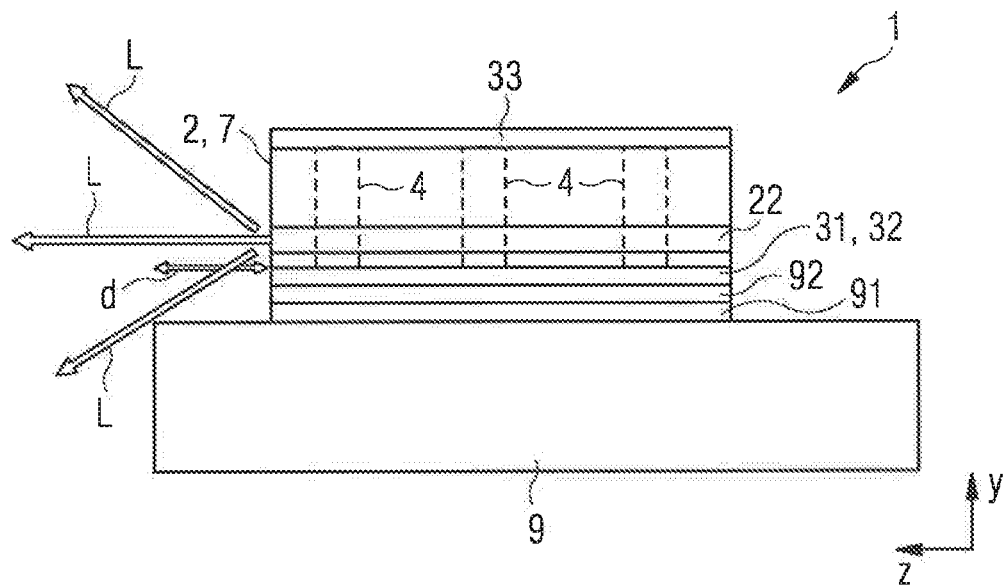

In the exemplary embodiments of FIGS. 17 and 18, the semiconductor layer sequence 2 and the growth substrate 7 or the optional replacement carrier are located on a carrier 9. Such a carrier 9 can also be referred to as a sub-mount. In this case, the position of the semiconductor layer sequence 2 is selected in such a way so that a front edge of the semiconductor layer sequence 2, at which the laser radiation L is emitted, is located at a distance d from a front edge of the carrier 9. The distance d is selected such that the laser radiation L does not just reach the carrier 9.

Carrier contact surfaces 91 can be larger than the contact surfaces 31, 32, see FIG. 17, or can also terminate flush with the contact surfaces 31, 32, see FIG. 18. The same applies to a connecting means 92, which is, for example, a solder or an electrically conductive adhesive.

In contrast to the case of light-emitting diode chips, the exemplary embodiments of the semiconductor lasers 1 according to FIGS. 1 to 18 are each edge emitters and not surface emitters. In addition, the through-connections 4 or the conductor rails 5 lie outside the generation region 22, unlike in light-emitting diodes. Furthermore, the generation region 22 can be separated from the through-connections 4 or the conductor rails 5 by a trench, again different than in the case of light-emitting diodes.

Furthermore, in one direction, in particular along the longitudinal direction y, the through-connections 4 or the conductor rails 5 have a high density whereas a lower density is present along the transverse direction x. In contrast, through-connections that may be present in light-emitting diodes are generally arranged in the same manner in both directions. A lateral current distribution is achieved in particular by the flat, light-impermeable and metallic current expansion element 33. Such a current expansion element 33 cannot be used in light-emitting diodes, since this would prevent light decoupling.

Figure 19:
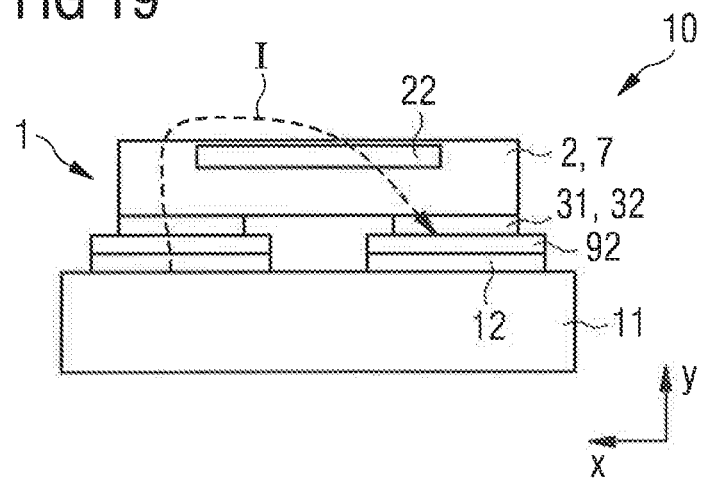
FIGS. 19 to 26 and FIGS. 27A to 27E show schematic sectional representations of exemplary embodiments of arrangements described herein with a semiconductor laser.

FIG. 19 illustrates an exemplary embodiment of an arrangement 10. In this case, a semiconductor laser 1, for example, as shown in connection with FIG. 2, is mounted directly on an electric driver 11. Between driver contact surfaces 12 of the driver 11 and the contact surfaces 31, 32, only the connecting means 92 is present. The contact surfaces 31, 32 are dimensioned such that, relative to the through-connections, not shown in FIG. 19, no significant increase in an electrical resistance takes place. In particular, a cross-sectional area of the contact areas 31, 32, 12 is larger than that of the non-illustrated through-connections or conductor rails. A current path I is schematically symbolized by a dashed line.

The driver 11 is based, for example, on silicon or SiGe or GaN or GaAs. In addition to the electrical control of the semiconductor laser 1, the driver 11 can also be designed as a heat sink for efficiently dissipating heat from the semiconductor laser 1. This can also apply to all other exemplary embodiments.

Figure 20:
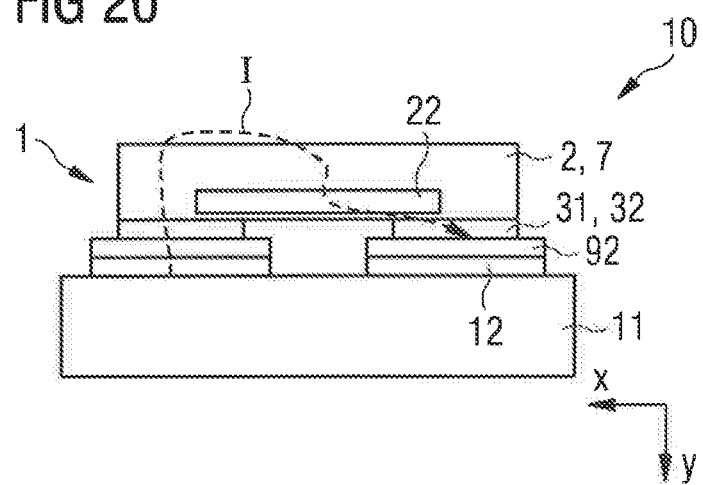

In the exemplary embodiment of FIG. 20, in contrast, a semiconductor laser 1 is used, for example, analogously to FIG. 1.

Figure 21:
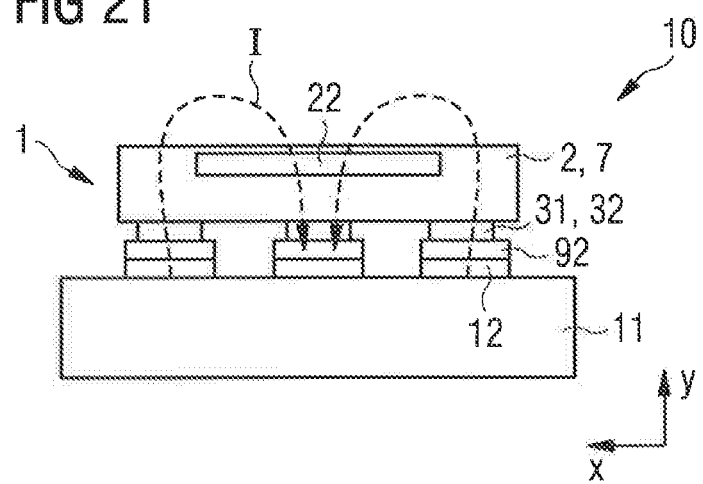
Figure 22:
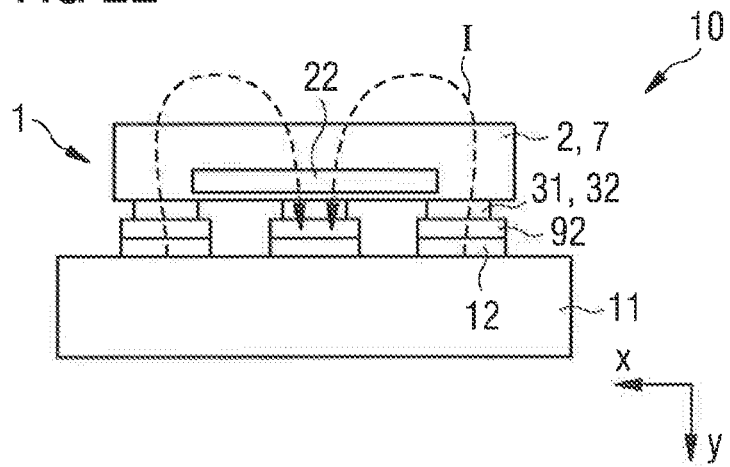

In the exemplary embodiment of FIG. 21, a plurality of contact surfaces are present, for example, for an anode contact or a cathode contact, see also FIG. 2. The same applies to FIG. 22, in particular in comparison with FIG. 1.

Figure 23:
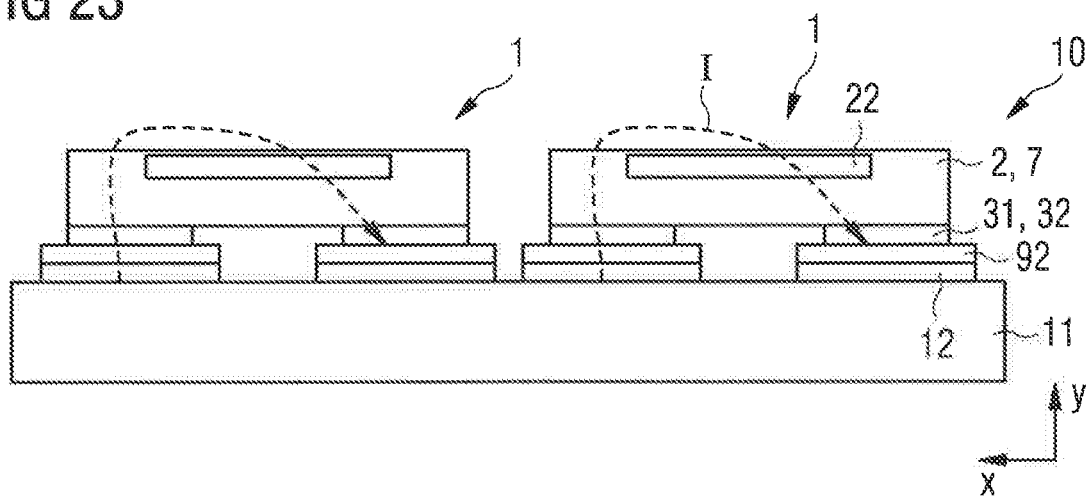

In the exemplary embodiment of FIG. 23, a plurality of the semiconductor lasers 1 are mounted next to one another on the driver 11. In this case, semiconductor lasers 1 configured analogously to FIG. 5 are used. Alternatively, semiconductor lasers 1 according to FIG. 1 can also be used.

Figure 24:
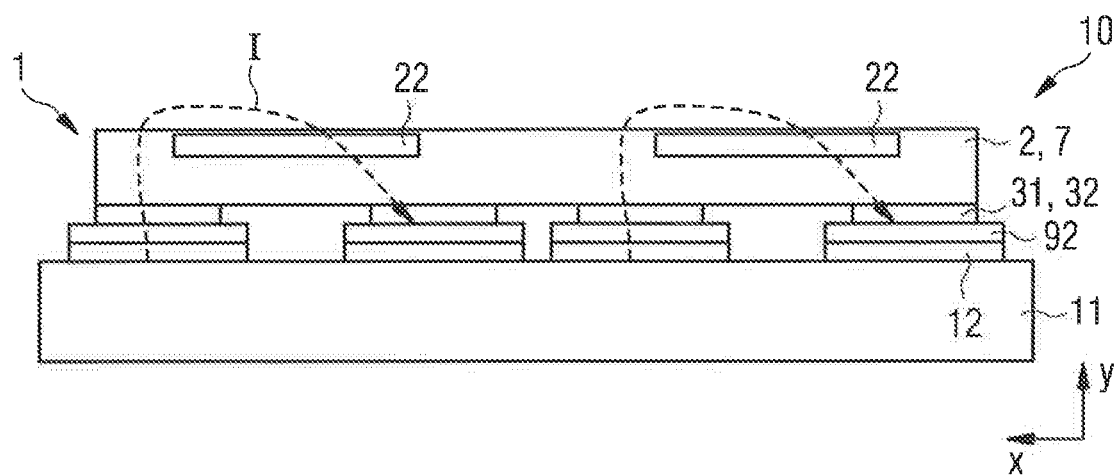

In the exemplary embodiment of FIG. 24, a plurality of the generation regions 22 are integrated in a common semiconductor laser 1. The semiconductor laser of FIG. 24 is constructed, for example, as explained in conjunction with FIG. 12. The generation regions 22 thus each have their own contact surfaces 31, 32.

Figure 25:
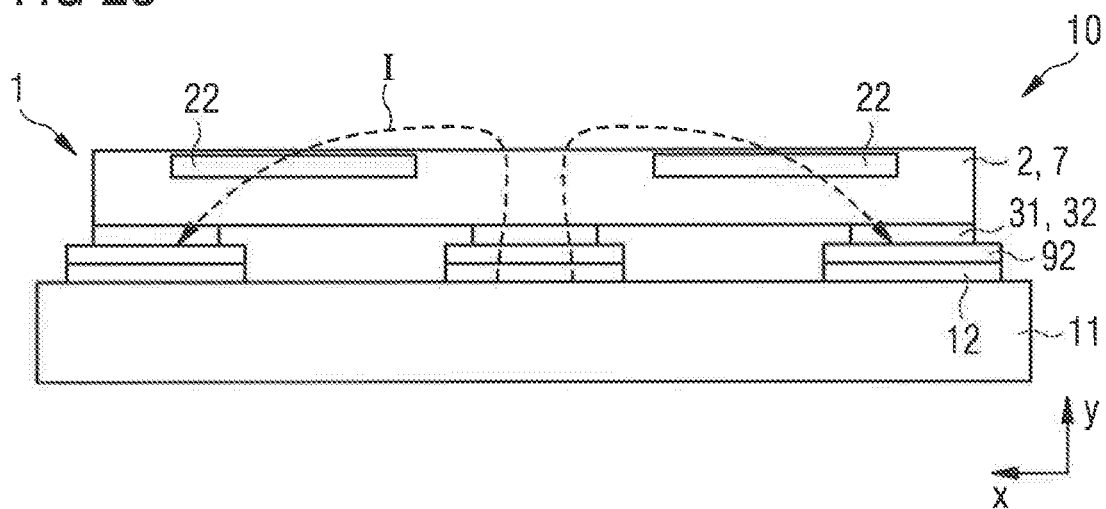

In contrast, electrical contact surfaces 31, 32 are provided for the generation regions 22 in FIG. 25, which divide the generation regions 22 at least in part, see the current profile I, as indicated by the dashed line in FIG. 25. The semiconductor laser 1 used in FIG. 25 corresponds, for example, to the semiconductor laser 1 explained in FIG. 11.

Figure 26:
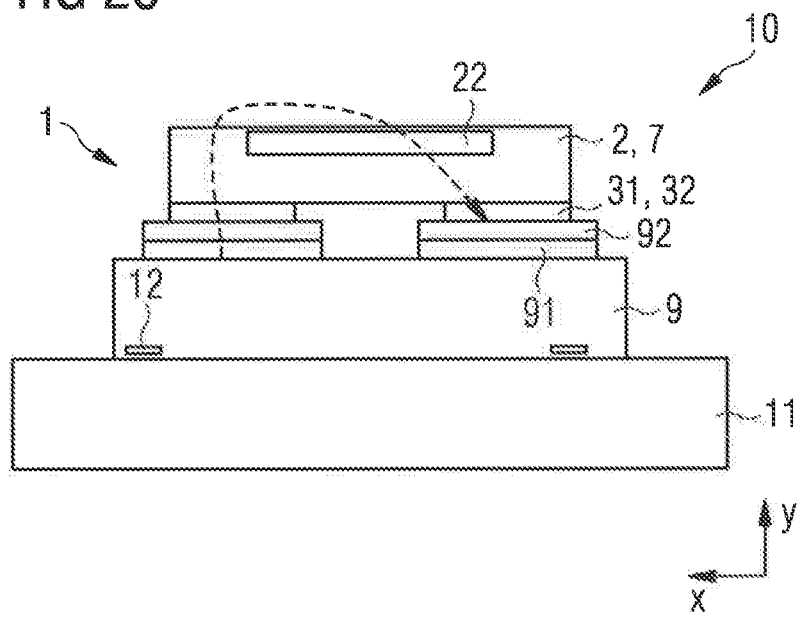

In the exemplary embodiment of FIG. 26, the carrier 9 is located between the driver 11 and the semiconductor laser 1 as an intermediate carrier or as a sub-mount. As a result, for example, an adaptation of the contact surfaces 31, 32 of the semiconductor laser 1 to the driver contact surfaces 12 can be achieved so that the semiconductor laser 1 and the driver 11 can be efficiently contacted with one another without bonding wires being necessary. Such carriers 9 can also be present in the exemplary embodiments of FIGS. 19 to 25.

FIG. 27 schematically illustrates further circuit details, which can be used in the same way for all other exemplary embodiments and with which particularly low total inductances can be achieved. The driver 11 particularly preferably comprises a switching element such as a transistor. The basic electrical circuit diagram in FIG. 27A is shown for the case of a transistor, wherein the base/gate G, the emitter/source S and the collector/drain D are shown schematically. Optionally, an RC element having a resistor R, which is connected in parallel with a capacitor C, is arranged upstream of the semiconductor laser 1.

Figure 27A:
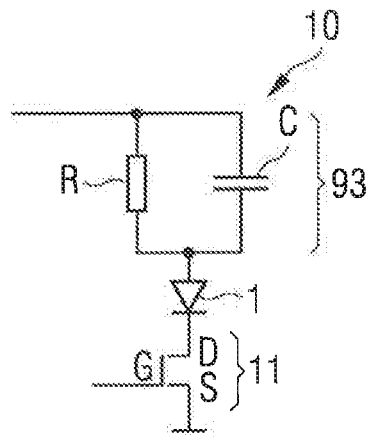
Figure 27B:
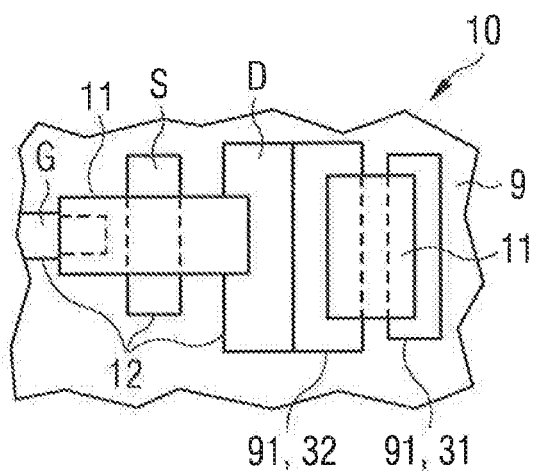
Figure 27C:
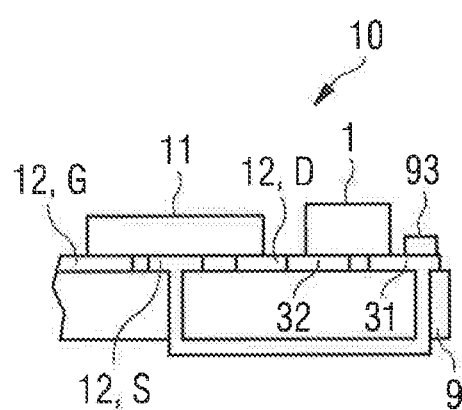

A schematic plan view is shown in FIG. 27B and a schematic sectional view is shown in FIG. 27C, in which the driver 11 and the semiconductor laser 1 are mounted on a common carrier 9. The driver contact surface 12, D can be designed to be contiguous with the contact surface 32, in particular configured as a cathode. The driver 11 overlaps with the driver contact surfaces 12, D, S, G and the semiconductor laser 1 overlaps with the contact surfaces 31, 32, seen in plan view. The driver contact surface 12, S can be led across a rear side of the carrier 9 and via electrical though-contacts to the contact surface 31, which is designed, for example, as an anode. On the anode side, the RC element 93 is optionally provided upstream of the contact surface 31.

Figure 27D:
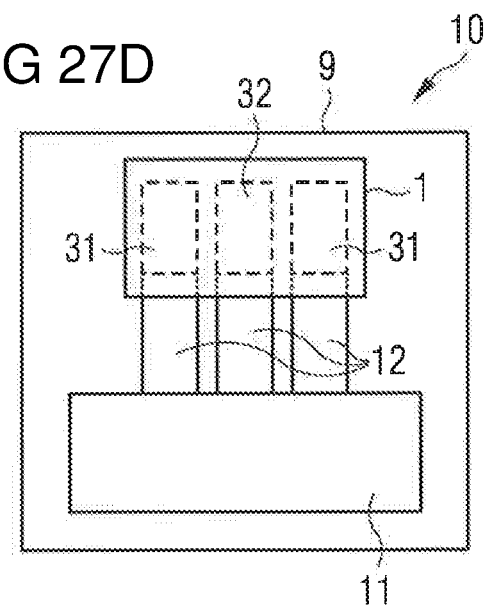

The plan view of FIG. 27D shows a coplanar arrangement 10, in which the driver 11 and the semiconductor laser 1 are located in the same plane on the carrier 9. Two contact surfaces 31, in particular anodes, and a central contact surface 32 are provided. Electrical lines can run along a direct path with a comparatively large width and/or thickness from the driver 11 to the semiconductor laser 1. The optional RC element, not shown in FIG. 27D, can be integrated in the driver 11, as is also possible in all other exemplary embodiments.

Figure 27E:
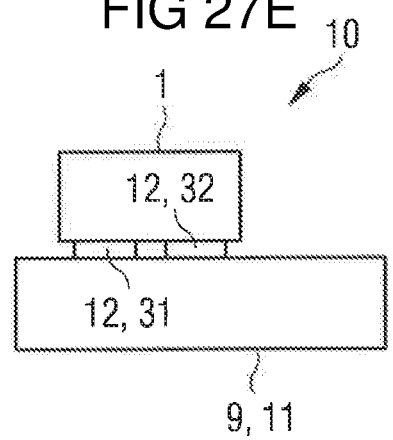

In the sectional view of FIG. 27E, it can be seen that the carrier 9 for the semiconductor laser 1 simultaneously forms the driver 11. The carrier 9 together with the driver 11 is, for example, an application-specific integrated circuit, ASIC for short. The driver 11 is directly connected to the semiconductor laser 1 by means of the contact surfaces 12, 31, 32.

The components shown in the figures follow, unless indicated otherwise, preferably in the specified sequence directly one on top of the other. Layers which are not in contact in the figures are preferably spaced apart from one another. If lines are drawn parallel to one another, the corresponding surfaces are likewise oriented parallel to one another. The relative thickness ratios, length ratios and positions of the drawn components relative to one another are correctly reproduced in the figures if not indicated otherwise.

The invention described herein is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A surface-mountable semiconductor laser comprising:
a semiconductor layer sequence having at least one generation region between a p-side and an n-side, the generation region configured to generate laser radiation;
at least two contact surfaces for external electrical contacting the p-side and the n-side, wherein the contact surfaces are located on the same side of the semiconductor layer sequence in a common plane so that the semiconductor laser is contactable without bonding wires;
at least one of a plurality of conductor rails extending from a side with the contact surfaces completely across the semiconductor layer sequence and, viewed in a plan view, adjoining an edge of the semiconductor layer sequence so that the conductor rails are only partly surrounded by a material of the semiconductor layer sequence; and
a plurality of through-connections running at least completely through the generation region coming from the side of the contact surfaces and, viewed in a plan view, lie within the semiconductor layer sequence so that the through-connections are surrounded all around by a material of the semiconductor layer sequence,
wherein the generation region is configured to be pulse operated with time-wise current densities of at least 30 A/mm$^2$,
wherein at least one of the through-connections or the conductor rails are arranged in at least two rows when viewed in plan view, and in each case at least one of the rows is located on each side of a longitudinal axis, the longitudinal axis being a resonator axis of the semiconductor laser, wherein each of the rows contains at least one of some of the through-connections and of the conductor rails, and
wherein the semiconductor laser is an edge emitter.

2. The semiconductor laser according to claim 1, wherein the semiconductor laser comprises the plurality of the conductor rails.

3. The semiconductor laser according to claim 1, wherein the semiconductor laser comprises the plurality of the through-connections.

4. The semiconductor laser according to claim 1,
wherein in the semiconductor layer sequence comprises at least two elongated trenches having oblique side surfaces and a bottom surface,
wherein the trenches completely penetrate the generation region and are configured to prevent parasitic laser modes, and
wherein the trenches are at least partially filled with a material absorbent to the laser radiation.

5. The semiconductor laser according to claim 4,
wherein at least some of the through-connections end at the bottom surface,
wherein, coming from the through-connections, a metallic current expansion element reaches until at least one of the p-side and the n-side across at least one of the side surfaces, and
wherein the current expansion element forms at least a part of the absorbent material.

6. The semiconductor laser according to claim 5,
wherein the through-connections lying on both sides of the longitudinal axis on the p-side or on the n-side are connected to one another via a continuous, flat current expansion element, and
wherein the current expansion element electrically contacts the generation region in a planar manner.

7. The semiconductor laser according to claim 4,
wherein at least one of the through-connections, coming from either the p-side or the n-side, terminates at the bottom surface, and the at least one through-connection covers at least a part of a side surface facing away from the generation region, and
wherein either the n-side or the p-side, from which the through-connection does not come from, is electrically contacted by the through-connection.

8. The semiconductor laser according to claim 1,
wherein at least one of the through-connections and the conductor rails are arranged mirror-symmetrically with respect to the longitudinal axis when viewed in plan view, and
wherein between 8 and 42 inclusive of the through-connections and the conductor rails are present.

9. The semiconductor laser according to claim 1,
wherein the semiconductor layer sequence has at least one planar current-conducting layer configured to laterally expand current at one side of the generation region and this side is free of a metallic or oxidic current expansion element,
wherein the current-conducting layer is in ohmic contact with one of the contact surfaces, and
wherein the current-conducting layer is based on the same semiconductor material system as the generation region and has at least a factor 5 higher average dopant concentration than the generation region.

10. The semiconductor laser according to claim 1, wherein, seen in plan view, a quotient of at least one of a surface area of the through-connections or a surface area of the conductor rails as a whole and a surface area of the generation region is between 0.02 and 0.2 inclusive.

11. The semiconductor laser according to claim 1, further comprising a growth substrate on which the semiconductor layer sequence is grown,
wherein the growth substrate is electrically conductive,
wherein the semiconductor layer sequence is based on AlInGaAs, and
wherein the generation region comprises a plurality of active layers which are connected to one another via tunnel diodes arranged electrically in series within the generation region.

12. The semiconductor laser according to claim 1,
wherein the semiconductor layer sequence has at least two generation regions arranged parallel to one another when seen in plan view, and
wherein at least one of the contact surfaces is located between the generation regions when viewed in plan view.

13. An arrangement comprising:
at least one semiconductor laser according to claim 1; and
a driver configured for pulsed operation of the semiconductor laser with time-wise currents of at least 10 A,
wherein the semiconductor laser is electrically connected to the driver without bonding wires so that all of the contact surfaces are located on a side of the semiconductor layer sequence facing the driver.

14. A method for operating the arrangement according to claim 13 comprising:
operating the semiconductor laser in a pulsed manner with time-wise current densities of at least 30 A/mm$^2$ in the generation region.

* * * * *